(12) United States Patent
Yamazaki et al.

(10) Patent No.: US 7,724,247 B2
(45) Date of Patent: May 25, 2010

(54) DISPLAY DEVICE WITH AMBIENT LIGHT SENSING

(75) Inventors: Shunpei Yamazaki, Tokyo (JP); Jun Koyama, Kanagawa (JP); Mitsuaki Osame, Kanagawa (JP); Yoshifumi Tanada, Kanagawa (JP); Ryota Fukumoto, Kanagawa (JP); Hiromi Yanai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1059 days.

(21) Appl. No.: 11/381,062

(22) Filed: May 1, 2006

(65) Prior Publication Data

US 2006/0244702 A1    Nov. 2, 2006

(30) Foreign Application Priority Data

May 2, 2005    (JP)    ............................. 2005-133803

(51) Int. Cl.
G09G 5/00    (2006.01)
(52) U.S. Cl. ...................................... 345/207; 345/690
(58) Field of Classification Search ........................ None
See application file for complete search history.

(56) References Cited

U.S. PATENT DOCUMENTS

| | | | |
|---|---|---|---|
| 3,838,209 A | | 9/1974 | Tsuchiya et al. |
| 4,386,345 A | * | 5/1983 | Narveson et al. ............... 345/22 |
| 5,333,243 A | * | 7/1994 | Best et al. ..................... 358/1.9 |

(Continued)

FOREIGN PATENT DOCUMENTS

| | | |
|---|---|---|
| EP | 1 103 946 A2 | 5/2001 |
| EP | 1 111 577 | 6/2001 |

(Continued)

OTHER PUBLICATIONS

Hajime Washio et al.; "TFT-LCDs with Monolithic Multi-Drivers for High Performance Video and Low-Power Text Modes"; *SID Digest '01 : SID International Symposium Digest of Technical Papers*; pp. 276-279; Jan. 1, 2001.

(Continued)

*Primary Examiner*—Alexander Eisen
*Assistant Examiner*—Matthew Yeung
(74) *Attorney, Agent, or Firm*—Fish & Richardson P.C.

(57) ABSTRACT

The object of the invention is to provide a display device of which the display is visible in a dark place or under strong external light. The present invention is a display device which performs display, changing the grayscale number corresponding to the external light strength, and a display device which can switch the display mode corresponding to contents displayed on the screen. The display contents include a text display mode displaying mainly characters and symbols, a picture display mode displaying images with a small number of colors such as a comic, a video mode displaying natural images with a large number of colors such as a photograph and a moving image, and the like. By switching the grayscale number arbitrarily according to these display modes, visibility can be ensured in a wide range from a dark place or under an indoor fluorescent light to under outdoor sunlight. For example, the grayscale number is switched so that display of from 2 to 8 grayscales is performed in the text display mode, display of from 4 to 16 grayscales is performed in the picture display mode, and display of from 64 to 1024 grayscales is performed in the video mode.

28 Claims, 22 Drawing Sheets

U.S. PATENT DOCUMENTS

| | | | |
|---|---|---|---|
| 5,363,118 A | | 11/1994 | Okumura |
| 5,406,305 A | * | 4/1995 | Shimomura et al. .......... 345/102 |
| 5,489,918 A | * | 2/1996 | Mosier ........................ 345/89 |
| 5,523,772 A | | 6/1996 | Lee |
| 5,818,419 A | | 10/1998 | Tajima et al. |
| 5,867,140 A | * | 2/1999 | Rader ........................ 345/98 |
| 5,933,130 A | * | 8/1999 | Wagner ..................... 345/690 |
| 6,037,917 A | | 3/2000 | Kawakami |
| 6,040,812 A | | 3/2000 | Lewis |
| 6,088,012 A | | 7/2000 | Shigeta et al. |
| 6,229,505 B1 | | 5/2001 | Fujii |
| 6,339,422 B1 | | 1/2002 | Kuwajima et al. |
| 6,396,508 B1 | | 5/2002 | Noecker |
| 6,414,661 B1 | | 7/2002 | Shen et al. |
| 6,417,824 B1 | | 7/2002 | Tokunaga et al. |
| 6,504,522 B2 | | 1/2003 | Shiraki et al. |
| 6,552,736 B2 | | 4/2003 | Honda et al. |
| 6,646,625 B1 | | 11/2003 | Shigeta et al. |
| 6,678,834 B1 | | 1/2004 | Aihara et al. |
| 6,693,614 B2 | | 2/2004 | Kamiya et al. |
| 6,738,036 B2 | | 5/2004 | Janssen et al. |
| 6,784,898 B2 | | 8/2004 | Lee et al. |
| 6,806,859 B1 | | 10/2004 | Kanoh et al. |
| 7,286,105 B2 | | 10/2007 | Akimoto et al. |
| 2001/0005193 A1 | | 6/2001 | Yokoyama |
| 2001/0005196 A1 | | 6/2001 | Ishii |
| 2001/0011989 A1 | | 8/2001 | Hayashi |
| 2001/0022565 A1 | | 9/2001 | Kimura |
| 2001/0033252 A1 | | 10/2001 | Yamazaki et al. |
| 2002/0000969 A1 | | 1/2002 | Ozawa |
| 2002/0011978 A1 | | 1/2002 | Yamazaki et al. |
| 2002/0015043 A1 | * | 2/2002 | Matsuda ..................... 345/596 |
| 2002/0024529 A1 | * | 2/2002 | Miller et al. ................. 345/690 |
| 2002/0047568 A1 | | 4/2002 | Koyama |
| 2002/0047852 A1 | | 4/2002 | Inukai et al. |
| 2002/0075249 A1 | | 6/2002 | Kubota et al. |
| 2002/0154151 A1 | | 10/2002 | Koyama |
| 2002/0158857 A1 | | 10/2002 | Iisaka |
| 2002/0163591 A1 | | 11/2002 | Tsutsui |
| 2002/0171607 A1 | | 11/2002 | Senda et al. |
| 2003/0025663 A1 | | 2/2003 | Waterman et al. |
| 2003/0058235 A1 | | 3/2003 | Moon |
| 2003/0063077 A1 | | 4/2003 | Koyama |
| 2003/0174153 A1 | | 9/2003 | Koyama |
| 2004/0095364 A1 | | 5/2004 | Koyama et al. |
| 2004/0189630 A1 | * | 9/2004 | Huh et al. .................... 345/418 |
| 2004/0257359 A1 | | 12/2004 | Muroi et al. |
| 2005/0007392 A1 | | 1/2005 | Kasai et al. |
| 2005/0012731 A1 | | 1/2005 | Yamazaki et al. |
| 2005/0017963 A1 | | 1/2005 | Yamazaki et al. |
| 2005/0017964 A1 | | 1/2005 | Yamazaki et al. |
| 2005/0127846 A1 | | 6/2005 | Kim |
| 2006/0055629 A1 | | 3/2006 | Van Woudenberg |
| 2006/0082568 A1 | | 4/2006 | Yamazaki et al. |
| 2006/0114213 A1 | | 6/2006 | Yokoyama |
| 2006/0262066 A1 | | 11/2006 | Yamazaki et al. |
| 2006/0273999 A1 | | 12/2006 | Yamazaki et al. |
| 2008/0084403 A1 | | 4/2008 | Kimura et al. |

FOREIGN PATENT DOCUMENTS

| | | |
|---|---|---|
| EP | 1 184 833 A2 | 3/2002 |
| EP | 1 249 822 | 10/2002 |
| EP | 1 298 637 A2 | 4/2003 |
| EP | 1 538 591 A2 | 6/2005 |
| GB | 2 177 829 | 1/1987 |
| JP | 08-069690 | 3/1996 |
| JP | 11-133921 | 5/1999 |
| JP | 2001-324958 | 11/2001 |
| JP | 2001-343933 | 12/2001 |
| JP | 2002-108285 | 4/2002 |
| JP | 2002-149113 | 5/2002 |
| JP | 2003-186455 | 7/2003 |
| TW | 78107405 | 1/1999 |
| WO | WO 2004/059605 A2 | 7/2004 |

OTHER PUBLICATIONS

European Search Report (European Application No. 06007738.5-1228) and EPO Communication mailed May 25, 2007, 7 pages.

European Search Report (European Application No. 06 009 376.2) dated Aug. 22, 2006, 8 pages.

European Office Action (European Application No. 06 009 376.2) dated Apr. 23, 2008, 9 pages.

* cited by examiner

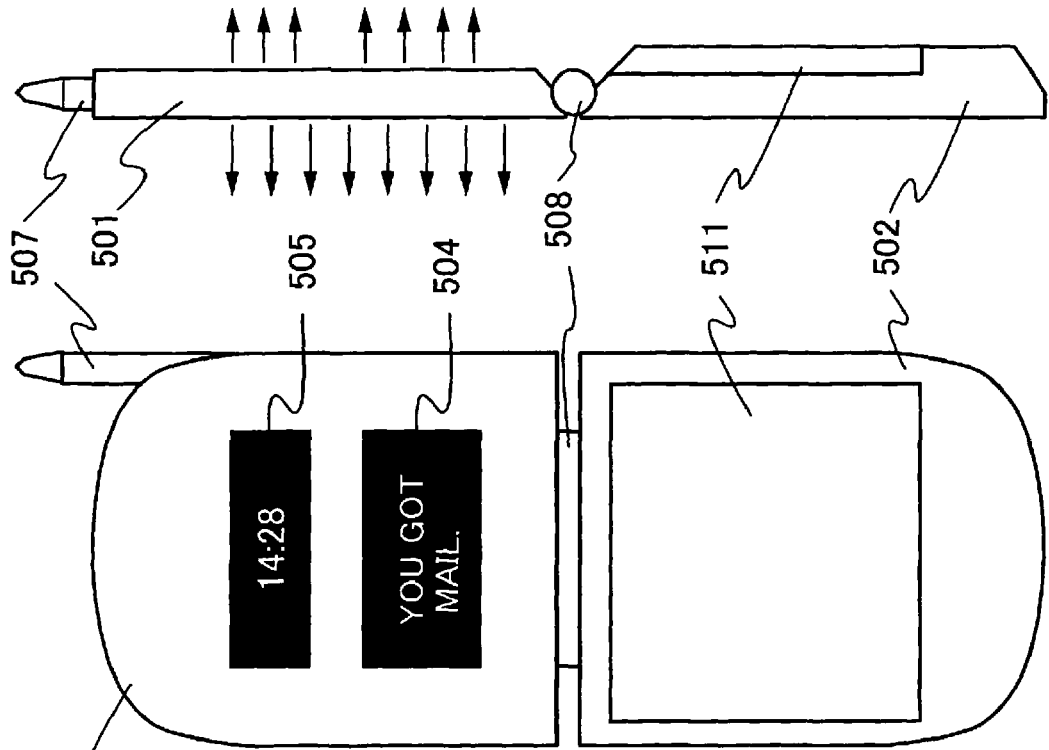
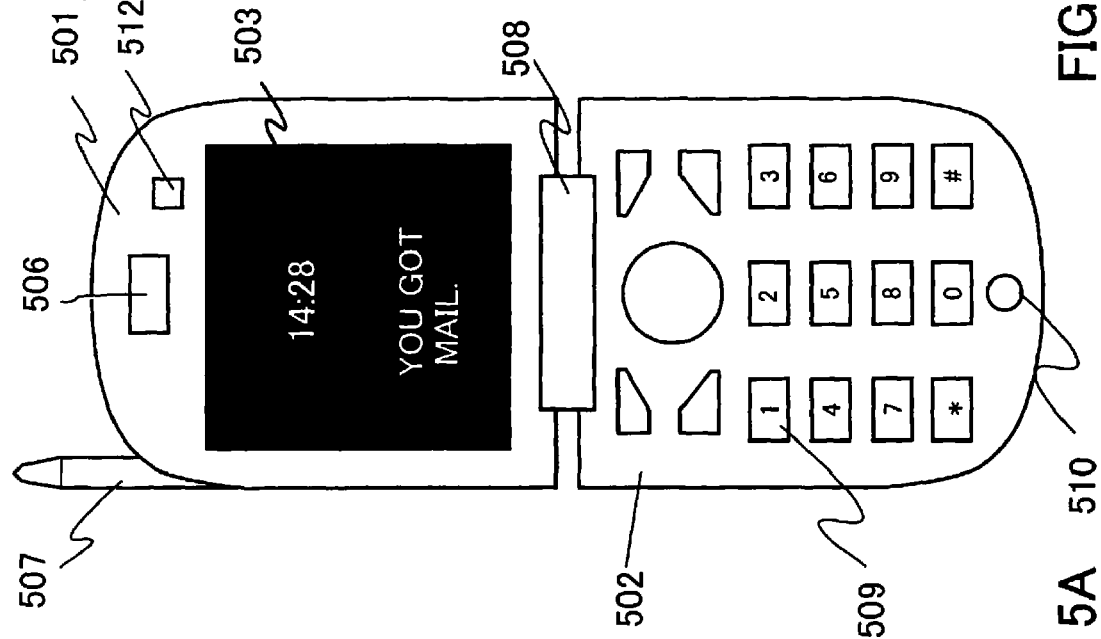
FIG. 5A  FIG. 5B  FIG. 5C

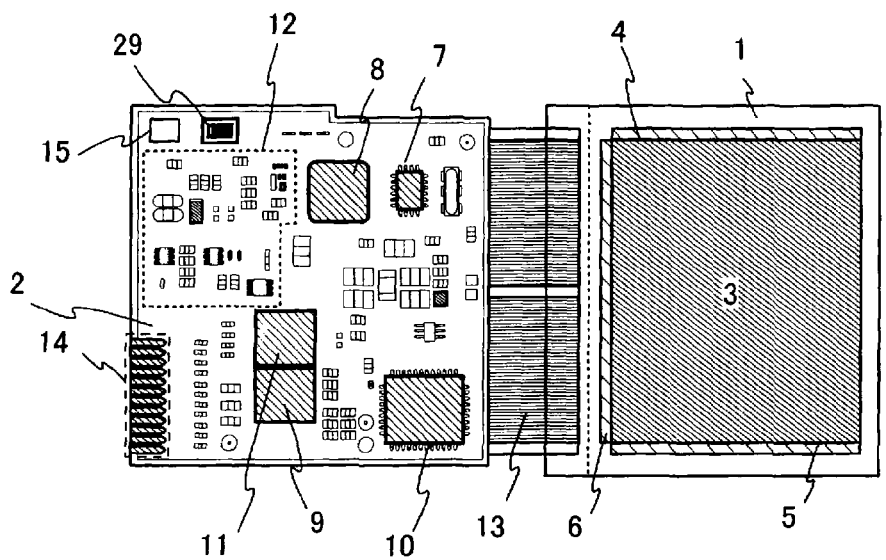
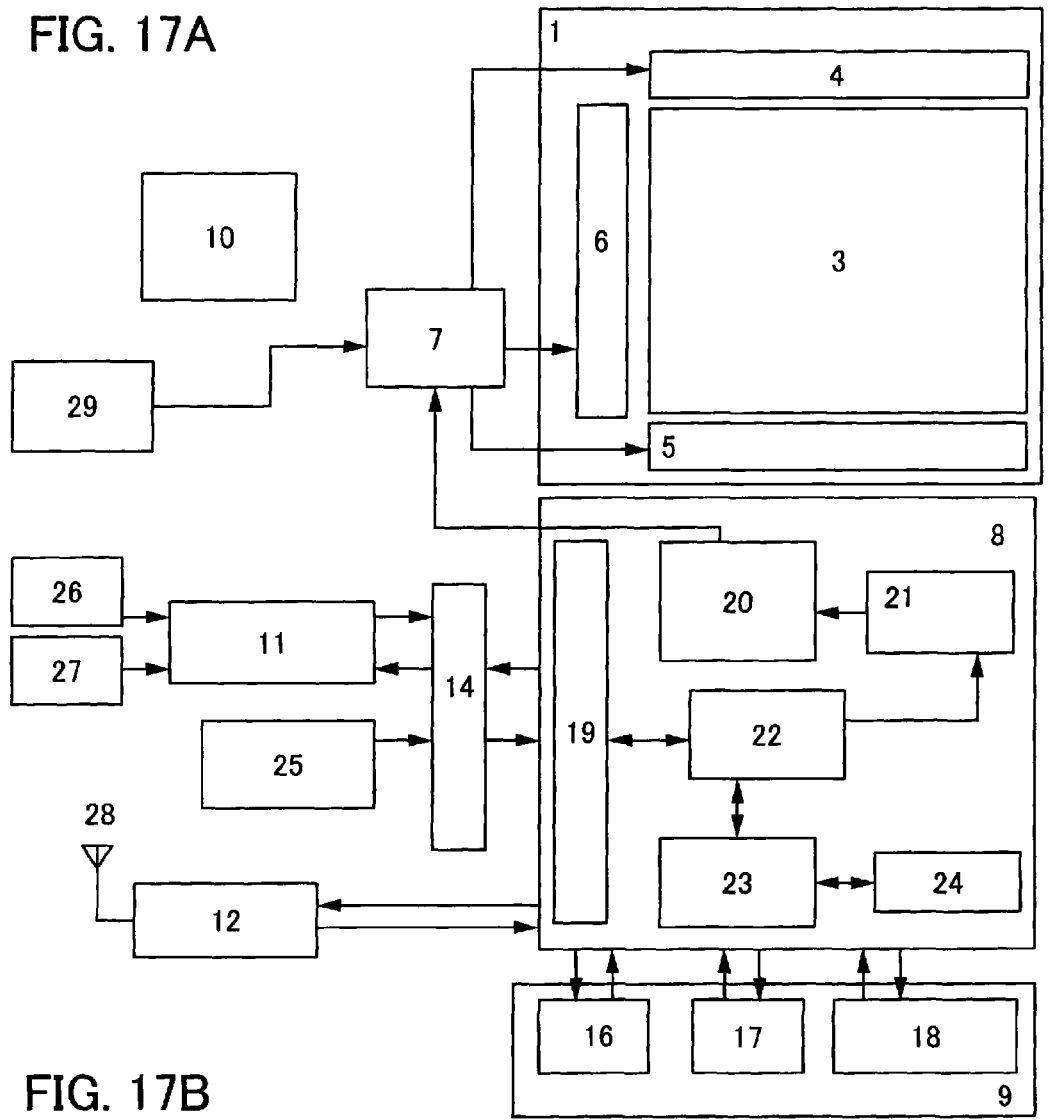
FIG. 17A
FIG. 17B

DISPLAY DEVICE WITH AMBIENT LIGHT SENSING

BACKGROUND OF THE INVENTION

1. Field of Invention

The present invention relates to a display device provided with a screen displaying characters, still images, moving images or the like, and also relates to a technique for improving visibility of a display screen in a wide variety of usage environments.

2. Description of the Related Art

A variety of electric appliances with a display screen structured by a liquid crystal panel, including a cell-phone, are prevalent. A liquid crystal panel has characteristics of being thin and light, and mobile laptop personal computers provided with a liquid crystal panel are produced. Furthermore, terminal devices called PDA (Personal Digital Assistant) are produced in large numbers, and becoming common.

As for display panels used in this way, not limited to a liquid crystal panel, the visual image quality is regarded as important, and panels provided with a function of adjusting the brightness and contrast automatically or manually are widely prevalent. For example, a liquid crystal display panel provided with an adjusting function which improves the visibility between one tone and another tone by changing transmission of the liquid crystal, without increasing luminance of a backlight of the liquid crystal panel is known (refer to Patent Document 1). Japanese Patent Laid-Open Publication No. 2003-186455

SUMMARY OF THE INVENTION

A liquid crystal panel has good visibility in an indoor environment of from 300 to 700 lux, but the visibility deteriorates significantly in an outdoor environment of 1,000 lux or more, which has been a problem. Although there is a reflective liquid crystal panel having a structure in which the pixel electrode reflects external light, the image quality is lowered under an indoor fluorescent light, and a fundamental solution has not been achieved. That is, ensuring of visibility in a wide range from a dark place or under an indoor fluorescent light to under outdoor sunlight has not been achieved yet.

It is an object of the present invention to provide a display device of which the display is visible in a dark place or under strong external light.

The present invention is a display device which performs display, changing the grayscale number corresponding to the external light strength. That is, a display device having a contrast ratio (white and black, for example) of 50 or more, preferably 100 or more, which performs display of a low grayscale when the external light strength is high, performs display of a high grayscale when the external light strength is low, and performs display of the middle grayscale when the external light strength is between the two. The display part of the display device changes these grayscale numbers corresponding to the external light strength, in the case where luminance when a total white signal is inputted is from 50 to 5000 cd/m$^2$.

The present invention is a display device which performs display, changing the grayscale number corresponding to the external light strength, and a display device which can switch the display modes corresponding to contents displayed on the screen. The display contents include a text display mode displaying mainly characters and symbols, a picture display mode displaying images with a small number of colors such as a comic, a video mode displaying natural images with a large number of colors such as a photograph and a moving image, and the like.

By switching the grayscale number arbitrarily according to these display modes, visibility can be ensured in a wide range from a dark place or under an indoor fluorescent light to under outdoor sunlight. For example, the grayscale number is switched so that display of from 2 to 8 grayscales is performed in the text display mode, display of from 4 to 16 grayscales is performed in the picture display mode displaying images with a small number of colors such as a comic, and display of from 64 to 1024 grayscales is performed in the video mode displaying natural images with a large number of colors such as a photograph and a moving image.

The switching of the grayscale number corresponding to external light is performed by a display device having a contrast ratio (white and black, for example) of 50 or more, preferably 100 or more, for example, in the following way: display of 2 grayscales is performed when the external light strength is 100,000 lux, display of from 2 to 8 grayscales is performed when the external light strength is from 10,000 to 100,000 lux, display of 4 to 16 grayscales is performed when the external light strength is from 1,000 to 10,000 lux, display of from 16 to 64 grayscales is performed when the external light strength is from 100 to 1,000 lux, and display of 64 to 1024 grayscales is performed when the external light strength is less than 100 lux.

One aspect of the invention is a display device which displays character information and a still image with a lower grayscale than the display grayscale of that time under strong external light such as sunny daytime sunlight. For example, it is a display device which performs display of from 2 to 8 grayscales in an environment under sunlight of sunny daytime or sunlight of cloudy daytime, and from 4 to 16 grayscales in an environment under sunlight an hour before sunset of a sunny day or under sunlight an hour after sunrise of a cloudy day, or in an environment under an indoor fluorescent light such as an office.

In this case, it can be structured so as to display lowering the grayscale after the external light strength becomes stronger.

One aspect of the invention is a display device which detects the external light strength by a light sensor, changes the grayscale by feeding back the value, and displays an appropriate image. That is, a display device having an external light strength detector which receives external light and outputs a signal corresponding to the external light strength, a grayscale number controller which changes the grayscale number according to the signal, and a signal processor which sends a video signal corresponding to the grayscale number to a driving circuit for display.

One aspect of the invention is a display device having an external light strength detector which receives external light and outputs a signal corresponding to the external light strength, a grayscale number controller which changes the grayscale number according to the signal, and a signal processor which sends a video signal such as text (character), a still image and a moving image with a predetermined grayscale number, to a driving circuit for display, working with the grayscale number controller.

In this way, by providing the grayscale number controller which changes the grayscale number according to the external light strength, between the external light strength detector and the signal processor which sends a video signal to the driving circuit on a display panel side, visibility of the information displayed on a display screen can be excellent.

According to the invention, by controlling the grayscale number of a display image according to the external light strength, a display device with excellent visibility can be provided. That is, a display device ensuring visibility in a wide range from a dark place or under an indoor fluorescent light to under outdoor sunlight can be obtained.

BRIEF DESCRIPTION OF THE DRAWINGS

In the accompanying drawings:

FIGS. 5A, 5B and 5C are diagrams showing an embodiment of a cell-phone using both sides light-emitting display panels.

FIGS. 17A and 17B are diagrams showing a module made by combining a display panel and a printed-circuit board.

DETAILED DESCRIPTION OF THE INVENTION

Embodiment Mode

Figure 1:
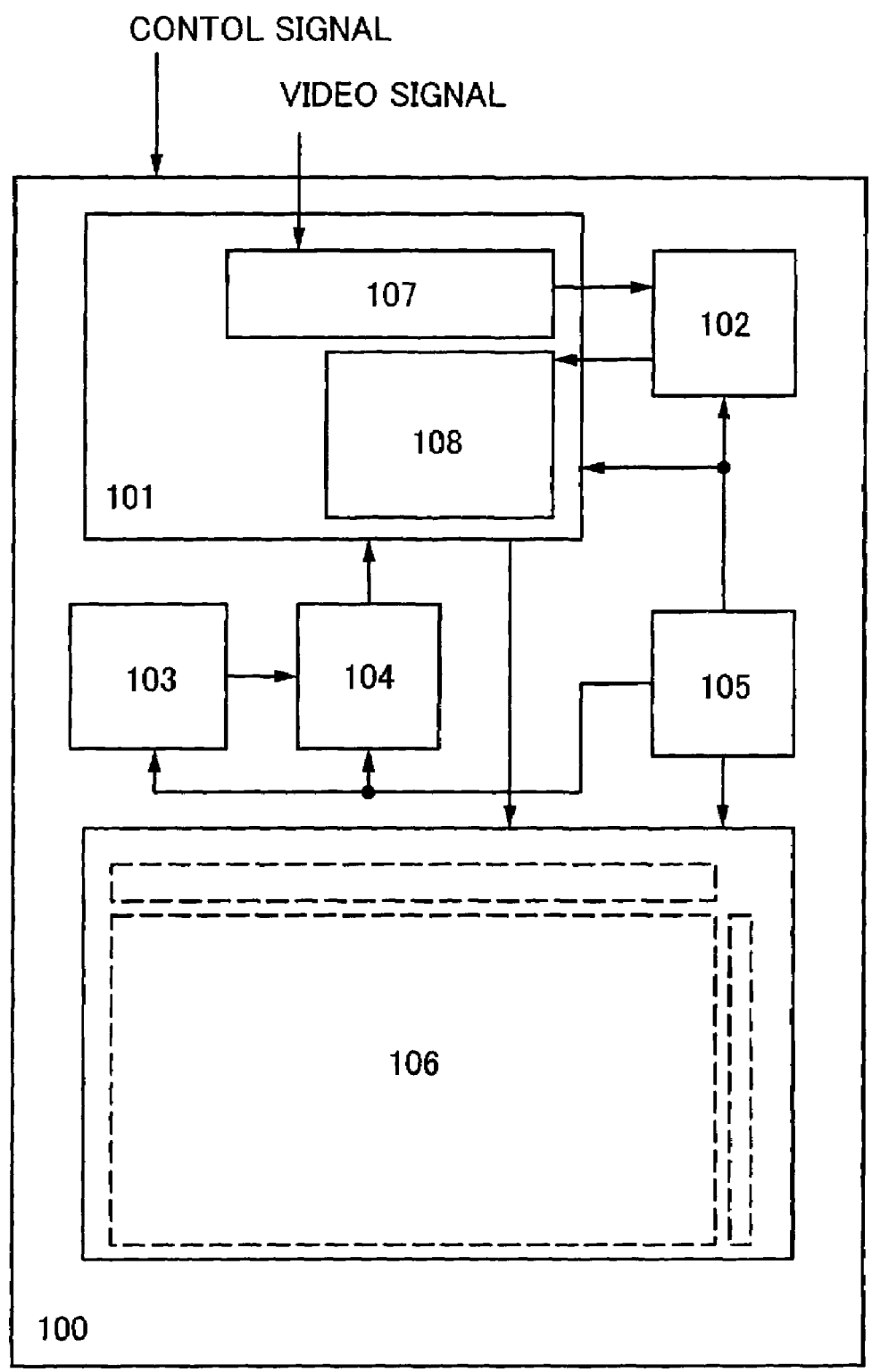
FIG. 1 is a diagram showing a structure of a display device of the invention.

Embodiment Modes of the invention will be described in detail, referring to the drawings. However, the invention is not limited to the following description, and it is easily understood by those in the art that the embodiment and details can be changed in various ways without departing from the purpose and scope of the invention. Therefore, the invention is not interpreted limited to the contents of embodiment modes described hereinafter. In the structure of the invention described hereinafter, a symbol referring to the same thing is used in different drawings in common.

Embodiment 1

An embodiment mode of the invention is shown in FIG. 1. FIG. 1 shows a block diagram of a display device of the invention. The display device 100 includes controller 101, a memory 102, a light sensor 103, an amplifier 104, a power supply 105 and a display panel 106.

The controller 101 generates a signal necessary for driving the display panel 106, based on a control signal and a video signal inputted from outside and a light sensor signal supplied from the amplifier 104. Then, it supplies these signals to the display panel 106. The memory 102 is used mainly for storing a video signal temporarily. In addition, the memory 102 is also used for storing information other than a video signal. The light sensor 103 detects external light (external light which the display device 100 receives). The output is supplied to the amplifier 104. The amplifier 104 amplifies an electrical signal outputted by the light sensor 103, and supplies the amplified electrical signal to the controller 101. When an electrical signal outputted by the light sensor 103 is large enough, the amplifier 104 can be omitted. The power supply 105 supplies a voltage or a current necessary for the display panel 106. The display panel 106 uses an electroluminescence (EL) element. It may be applied to FED (field emission display) also.

The display device 100 changes the total grayscale number of an image displayed on a display screen of the display panel 106, based on the output of the light sensor 103. As the light sensor 103, a photodiode or a phototransistor can be applied. Specifically, when the display device 100 receives strong external light and the output of the light sensor 103 becomes over a certain value, the total grayscale number of an image displayed on the display screen of the display panel 106 is decreased. When the display device 100 receives strong external light, a distinction between a grayscale and another grayscale becomes unclear, and an image displayed on the display screen of the display panel 106 is blurred. However, by decreasing the total grayscale number according to external light which the display device 100 receives, as described above, a distinction between a grayscale and another grayscale becomes clear and visibility of the display screen of the display panel 106 can be improved.

Furthermore, in the case where the total grayscale of an image displayed on the display screen of the display panel 106 is set to be 2 grayscales by the output of the light sensor

103, although a black display image is displayed on a white background image usually, it may be inverted so that a white display image is displayed on a black background image. In this way, visibility of the display screen can be further improved. In addition, by increasing luminance of the white display image, visibility of the display screen can be further improved. The combination of a background image and a display image is not limited to the white display on the black background, and arbitrary color combinations can be used, as long as the combination can make a good contrast (LD ratio is clear).

The output of the light sensor 103 is sent to the controller 101 via the amplifier 104. The controller 101 detects whether or not the output of the light sensor 103 is over a certain value, at a grayscale output selecting part 108. When the output of the light sensor 103 does not reach the certain value, the total grayscale number of a video signal outputted to the display panel 106 is not changed. On the other hand, when the output of the light sensor 103 is the certain value or more, the total grayscale number of a video signal outputted to the display panel 106 is corrected to be smaller. As for grayscale of a video signal, the grayscale number is changed by a grayscale converting part 107. And the video signals are stored in the memory 102. Then, based on the output of the light sensor 103, video signals of the total grayscale number which is suitable for the external light are selected by the grayscale output selecting part 108 and supplied to the display panel 106.

As shown in Table 1, indoor or outdoor brightness varies according to the lighting condition, the climate condition such as weather, and time. For example, the illuminance in a room with lighting is approximately 800 to 1,000 lux, the illuminance under a cloudy sky of daytime is approximately 32,000 lux, and the illuminance under a clear sky of daytime reaches 100,000 lux.

TABLE 1

| Brightness (lux) | Rough Indication of Brightness | (lux) |
|---|---|---|
| 1,000,000 | Toyama Beach in midsummer | >100,000 |
| | Sunlight of Sunny day in Daytime | 100,000 |
| | Sunlight of Sunny day at 10 am | 65,000 |
| | Sunlight of Sunny day at 3 pm | 35,000 |
| | Sunlight of Cloudy day in Daytime | 32,000 |
| | Sunlight of Cloudy day at 10am | 25,000 |
| 10,000 | Sunlight of Cloudy day after 1 hour from sunrise | 2,000 |
| 1,000 | Sunlight of Sunny day at 1 hour before sunset | 1,000 |
| | Lighting of Pachinko Parlors | 1,000 |
| | Lighting of Department Store | 500-700 |
| | Fluorescent Lamp of Office | 400-500 |
| | Sunlight at Sunrise/Sunset | 300 |
| | Two 30 W Fluorescent Lamp in eight-mat room | 300 |
| | Arcade at night | 150-200 |
| 100 | Under Fluorescent Lamp | 50-100 |
| | 30 cm away from Lighter | 15 |
| 10 | 20 cm away form candle | 10-15 |
| | Civil Twilight (Zenith Distance of Sun 96 degree) | 5 |
| 1 | Moonlight | 0.5-1 |
| | Nautical Twilight (Zenith Distance of Sun 102 degree) | 0.01 |
| | Astronomic Twilight (Zenith Distance of Sun 108 degree) | 0.001 |

A result of comparison among visibilities of a display panel using electroluminescence (EL panel), a transmissive liquid crystal panel (transmissive LCD panel), a semi-transmissive liquid crystal panel (semi-transmissive LCD panel), and a reflective liquid crystal panel (reflective LCD) under conditions with such various brightness is shown in Table 2.

TABLE 2

| | | 500~1500[lx] | | ~10000[lx]~ | | ~100000[lx]~ | | |
|---|---|---|---|---|---|---|---|---|
| | | in Room → | → in Lighted Hall → | | → in the Open air of Cloudy day→ | | → in the Open air of Sunny day | power consumption |
| EL Panel (2.0 QVGA) | 2 tone 8 tone | Good visibility is obtained with natural image and text. | ◎~○ | Good visibilities are obtained with Text. In low contrast, Visibility decreases, when background color is close to the contrast. | ○ | Visibility of Text is kept. In low contrast, Visibility decreases. | ○~Δ Δ | ◎ ◎ |
| | Natural Image (>64 tone) | | | In low contrast, Visibility decreases, when peripheral display part is Halftone. | Δ | Visibility becomes exacerbated. In low contrast, Visibility decreases. | Δ~X | ○ |
| Transmissive LCD Panel (1.9 QVGA) | | Good visibility is obtained with natural image and text. However, contrast decreases compared with that of EL panel. | ◎~○ | Same as above. Visibility of Text is on equality with EL Panel. However, Visibility of Natural Image has no advantage over EL Panel. | Δ~X | Visibility becomes exacerbated. Sometime, viewer can not have visual under Direct sunshine. | X | ○~Δ |
| Semi-Transmissive LCD Panel (2.1 QCIF+) | | Good visibility is obtained with natural image and text. However, contrast decreases compared with those of EL panel and tranmissive LCD panel. | ○ | Comparatively good visibility of Natural Image is obtained. Contrast does not decrease. Color does not shift. | ○ | Comparatively good visibility is kept, since reflection component of external light increases. | ○ | ○ |

TABLE 2-continued

| | 500~1500[lx] | | ~10000[lx]~ | | ~100000[lx]~ | | |
|---|---|---|---|---|---|---|---|
| | in Room → | → in Lighted Hall → | → in the Open air of Cloudy day→ | | → in the Open air of Sunny day | power consumption |
| Reflection LCD Pannel | Visibility decreases eminently. In low contrast, visibility decreases. | Δ~X | In low contrast, visibility decreases when peripheral region is Halftone. | ○ | Comparatively good visibility is kept, since reflection component of external light increases. | ○ | ◎ |

As a result, in an environment with brightness of up to approximately 1,500 lux (mainly indoor, such as a hall with lighting), good visibilities are obtained from the EL panel and various liquid crystal panels except the reflective liquid crystal panel, with any display pattern (a natural image, text (characters and symbols) and the like). On the other hand, in an environment of 10,000 lux (cloudy daytime), in the case of the EL panel and the transmissive liquid crystal panel, visibility of a part where the contrast is low, such as a half-tone part, tends to be significantly decreased when a natural image is displayed. However, even in this case, visibility of the EL panel is better than that of the transmissive liquid crystal panel. In addition, as for the EL panel, the visibility recovers when the grayscale number is decreased (from 2 to 8 grayscales), and a visibility having no problem practically is obtained especially for text display. On the other hand, as for the semi-transmissive liquid crystal panel, even though the contrast is slightly low in environments of indoor to outdoor overall, a good visibility is obtained in an environment of 10,000 lux. The reflective liquid crystal panel is excellent in power consumption, but the visibility tends to decrease in an environment with relatively low illuminance, such as indoor. The power consumption of the transmissive liquid crystal panel is higher than that of the reflective liquid crystal panel, since the backlight consumes power. On the other hand, in the case of the EL panel, the power consumption is lowered in a display mode with the reduced grayscale number.

As is clear from Table 2, by using an EL panel and a display mode of which the grayscale number is adjusted according to the external light strength, a display device of which the visibility is ensured in environments of indoor to outdoor and the power consumption is lowered can be provided.

For example, as for the display device 100 shown in FIG. 1, in the case where it is detected by the output of the light sensor 103 that the display device 100 is receiving external light of from 10 to 100 lux, the total grayscale number is from 64 to 1024 grayscales and not changed. Furthermore, in the case where it is detected by the output of the light sensor 103 that the display device 100 is receiving external light of from 100 to 1,000 lux, the total grayscale number is corrected to be from 16 to 64 grayscales. Furthermore, in the case where it is detected by the output of the light sensor 103 that the display device 100 is receiving external light of from 1,000 to 10,000 lux, the total grayscale number is corrected to be from 4 to 16 grayscales. Furthermore, in the case where it is detected by the output of the light sensor 103 that the display device 100 is receiving external light of from 10,000 to 100,000 lux, the total grayscale number is corrected to be from 2 to 4 grayscales.

The correction of the gray scale number according to the external light is not limited in the above example. In general, the gray scale number is i when the strength of the external light is x lux, the gray scale number is j when the strength of the external light is y lux, and the gray scale number is k when the strength of the external light is z lux, wherein the natural numbers i, j and k fulfills formula i>j>k, and wherein the positive real number x, y, z fulfills formula x<y<z.

To the controller 101, an analog video signal is supplied from outside. In the case where the display screen of the display panel 106 performs analog grayscale display and the total grayscale number of a standard video signal is 64 grayscales, video signals of which the total grayscale number is 32 grayscales, 16 grayscales, 8 grayscales, and 4 grayscales respectively are generated beforehand in the grayscale converting part 107, and these video signals are stored in the memory 102. And a video signal of which the total grayscale number is suitable for external light is selected by the grayscale output selecting part 108 and supplied to the display panel 106, based on the output of the light sensor 103.

Furthermore, in the case where the display screen of the display panel 106 performs digital grayscale display, the controller 101 converts an analog video signal into a digital video signal. Then, in the case where the total grayscale number of a standard video signal is 6 bits (64 grayscales), video signals of 5 bits (32 grayscales), 4 bits (16 grayscales), 3 bits (8 grayscales), and 2 bits (4 grayscales) are generated beforehand in the grayscale converting part 107. And these picture signals are stored in the memory 102. And a video signal of which the total grayscale number is suitable for external light is selected by the grayscale output selecting part 108 and supplied to the panel 306, based on the output of the light sensor 103.

Furthermore, the grayscale numbers are changed depending on an image displayed by the display screen of the display panel 106. For example, there is the case where a still image is displayed and the mode is for displaying text such as a character and an icon. In this case, the total grayscale number is set to be from 2 to 8 grayscales. Furthermore, there is the case where a still image is displayed and the mode is for displaying an image. In this case, the total grayscale number is set to be from 4 to 16 grayscales. Furthermore, there is the mode for displaying a moving image. In this case, the total grayscale number is set to be from 16 to 64 grayscales, or from 16 to 1024 grayscales. In this way, by changing the grayscale number according to each mode, the power consumption can be reduced. The above-described mode may be determined by the controller 101, based on a video signal supplied to the controller 101.

Furthermore, a selection switch with which a user selects the display mode may be provided for the display device 100 so that the above-described mode is selected by the user operating the selection switch. Furthermore, even in the case where the display mode is selected by the selection switch, the grayscale of the selected display mode may be increased or decreased automatically depending on the signal of the light sensor 103 (the external light strength).

Figure 2B:
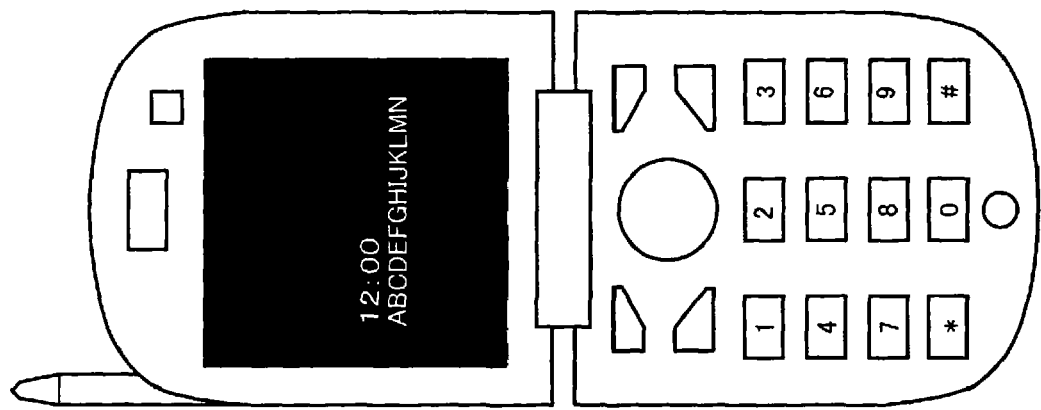
FIGS. 2A and 2B are diagrams showing an embodiment of a cell-phone which can switch the display modes according to the external light strength.
Figure 2A:
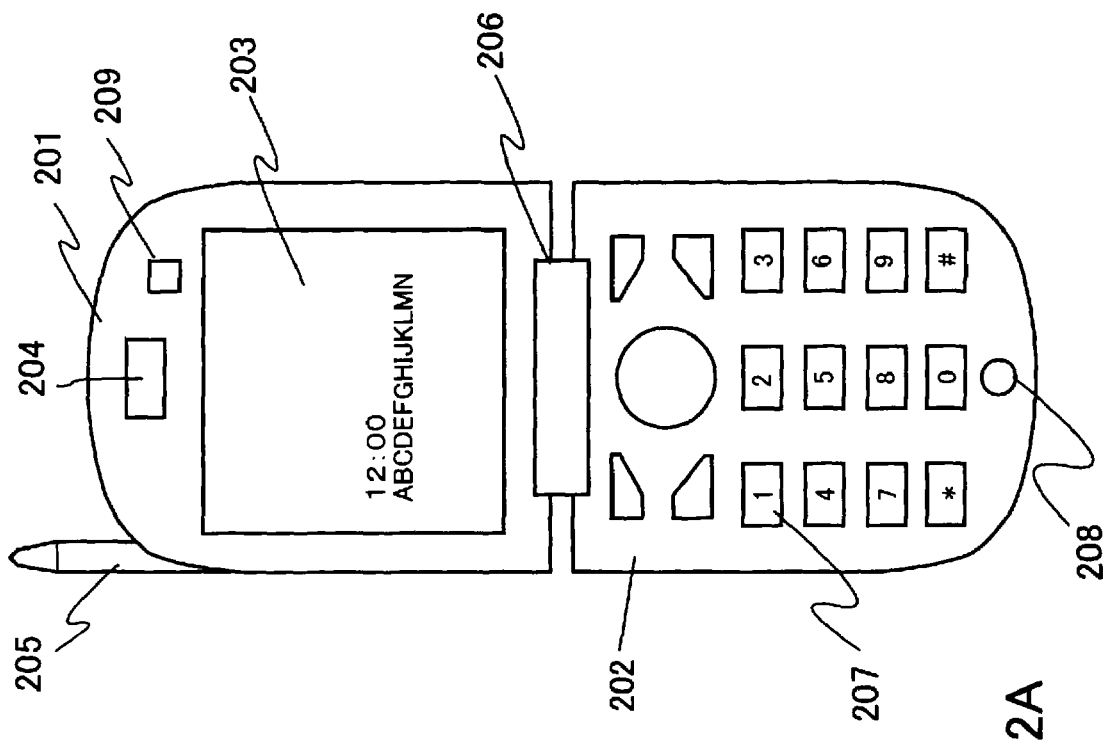

A mode of a cell-phone which can switch the display mode according to the external light strength is shown in FIGS. 2A and 2B. The cell-phone shown in FIG. 2A is constituted by a first chassis 201, a second chassis 202, a display screen 203, a speaker 204, an antenna 205, a hinge 206, a keyboard 207, a microphone 208 and a light sensor 209. A display device of the invention is put in the first chassis 201.

FIG. 2A shows a display of the case where external light is weak. On the display screen 203, black characters are displayed on a white background image. In the case where external light is weak, sensitivity of eyes is adapted to the light-emitting luminance of the display screen.

FIG. 2B shows a display of the case where external light is strong. In the case where external light is strong, a white background image is defeated by external light. So, the external light strength is detected by the light sensor 209, and the background image is changed to black, as shown in FIG. 2B. By setting the background image black like this, the area of the light-emitting part can be reduced. And, by concentrating the power on the small white part, the white part can be displayed more clearly.

Although this embodiment mode shows the case of a cell-phone, the invention is not limited to this, and can be used for various electronics using a display device, such as a PDA, a video camera, a digital camera, a portable DVD, a portable television, a game console and a computer.

Embodiment Mode 2

Figure 3A:
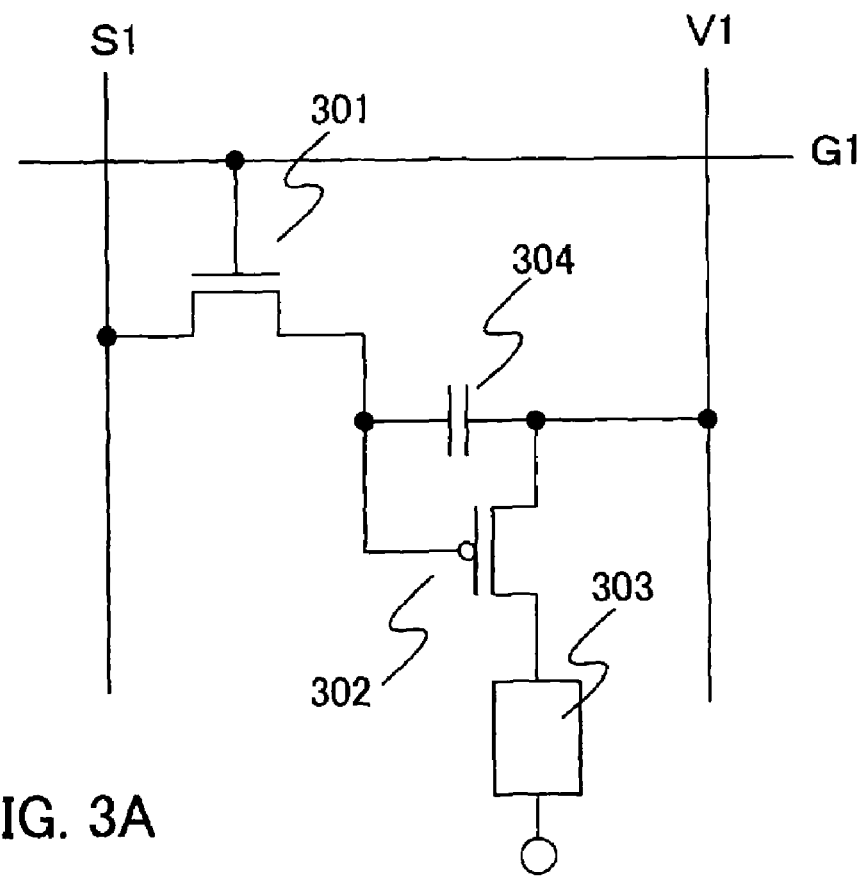
FIGS. 3A and 3B are diagrams showing a constitutional example of a pixel of a display device described in Embodiment Mode 1.
Figure 3B:
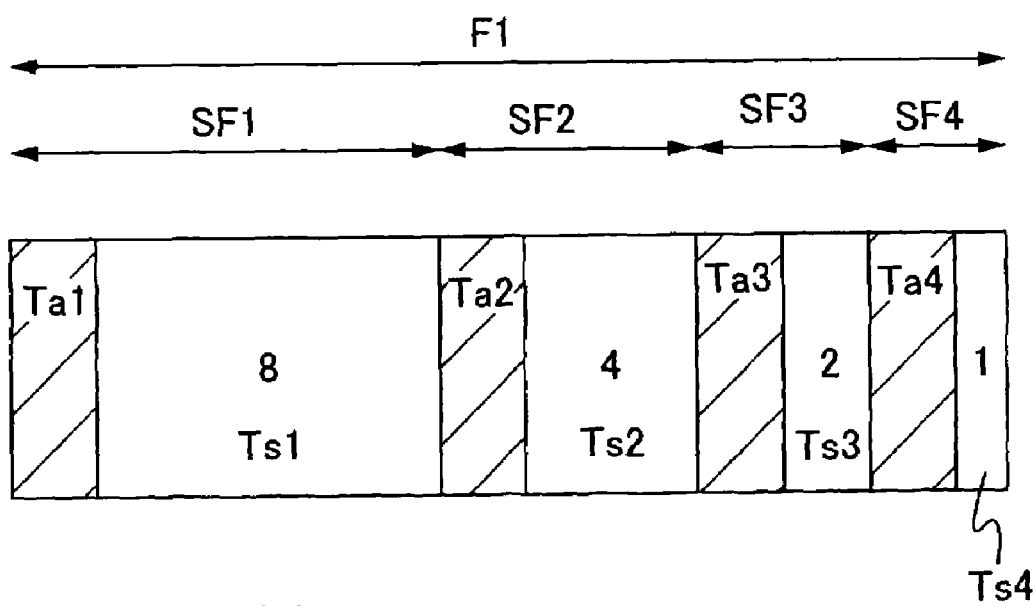

A configuration example of a pixel of the display device shown in Embodiment Mode 1 will be shown. FIGS. 3A and 3B shows a pixel example of a display device which can operate with a time grayscale method. The pixel shown in FIGS. 3A and 3B is constituted by a thin film transistor (hereinafter also referred to as TFT). FIGS. 3A and 3B show a pixel which drives a light-emitting element 303 with time grayscale. This pixel is constituted by the light-emitting element 303, a driving TFT 302, a retention volume 304 and a switching TFT 301. A gate of the switching TFT 301 is connected to a gate signal line G1, and when the gate signal line G1 is high, it becomes on and the data of a source signal line S1 is written on the retention volume 304 and a gate of the driving TFT 302. When the driving TFT 302 becomes on, a current from a power line V1 flows to the light-emitting element 303, via the driving TFT 302. This condition is maintained till the next writing is performed.

FIG. 3B shows a timing chart of the time grayscale. In this example, the case of 4 bits will be described, but not limited to 4 bits. One frame is constituted by four sub-frames SF1 to SF4. Each sub-frame is constituted by an addressing period (writing period) Ta1 to Ta4 and a sustaining period (lighting period) Ts1 to Ts4. By setting the sustaining periods Ts1: Ts2: Ts3: Ts4=8: 4: 2: 1, each bit corresponds to the sustaining period and time grayscale becomes possible. At this time, lighting is not performed in the addressing periods, and only addressing is performed.

Embodiment Mode 3

Figure 4:
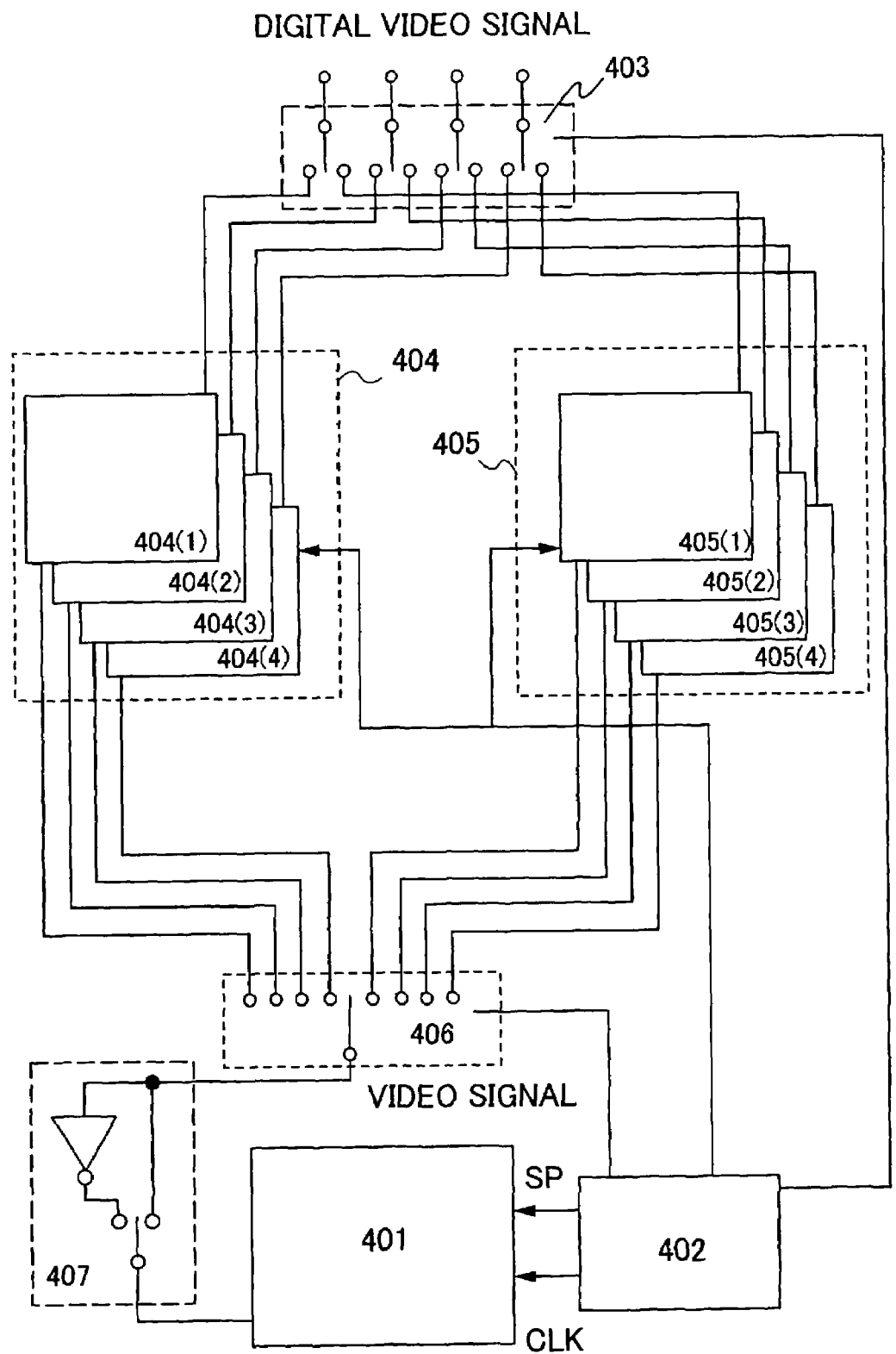
FIG. 4 is a diagram showing an example of a system creating an image of which the signal light and dark is inverted, described in Embodiment Mode 1.

As for the display device shown in Embodiment Mode 2, an example of a system to form an image of which light and dark of signals are inverted, as described in Embodiment Mode 1, is shown in FIG. 4. In this example, a digital video signal of 4 bits is sub-frame-converted, but not limited especially to 4 bits. The operation will be described hereinafter. First, a control circuit 402 inputs a digital video signal to a first memory 404 via a switch 403. When the data of a first frame is all inputted to the first memory 404, the switch 403 is switched to a second memory 405, and a digital video signal of a second frame is written. By this means, a combination of a white background image and a black display image, or a combination of a black background image and a white display image can be displayed. The output of a picture signal selection switch 406 is inputted to a switch 407, and it can be selected whether a signal of the picture signal selection switch 406 is inputted without inverted or inverted, to a display panel 401. In the case where dark-light inversion is necessary, input may be performed after the inversion. This selection is performed by a display controller.

Embodiment Mode 4

A mode of a cell-phone using a both sides light-emitting display panel is shown in FIGS. 5A, 5B and 5C. The cell-phone shown in FIGS. 5A, 5B and 5C is constituted by a first chassis 501, a second chassis 502, a first display screen 503, a second display screen 504, a third display screen 505, a speaker 506, an antenna 507, a hinge 508, a keyboard 509, a microphone 510, a battery 511 and a light sensor. FIGS. 5A, 5B and 5C show a condition where external light is strong and the background image is black. FIG. 5A shows a diagram of the opened inside, FIG. 5B shows the outside, and FIG. 5C shows the lateral side. A display device of the invention is put in the first chassis 501.

In FIGS. 5A, 5B and 5C, the first display screen 503 is a main display, and the second display screen 504 is a sub-display, and the case where two displays are placed is shown, but the number is not limited. The display area of the sub-display is structured smaller than the display area of the main display.

As for a sell-phone like this, the system shown in FIG. 4 can reverse a picture right and left by using a control circuit and a memory circuit, also. In FIG. 4, the control circuit 402 inputs a digital video signal to a first memory 404 via a switch 403, first. When the data of a first frame is all inputted to the first memory 404, the switch 403 is switched to a second memory 405, and a digital video signal of a second frame is written.

On the other hand, in the meanwhile, a video signal selection switch 406 is sequentially connected to first memories 404-1 to 404-4, and a signal stored in the first memory 404 is inputted to a display panel 401. When the data of a second frame is all inputted to the second memory 405, the switch 403 is switched to the first memory 404, and a digital video signal of a third frame is written. The video signal selection switch 406 is sequentially connected to second memories 405-1 to 405-4, and a signal stored in the second memory 405 is inputted to the display panel 401. By repeating this, a sub-frame can be formed.

In the case of inverting a picture right and left, signals of each line of the display are called up reversely when the first memory 404 or the second memory 405 is called up. In this way, as for a display device performing a sub-frame conversion, both sides light emission becomes possible by changing the order of calling up memories.

Embodiment Mode 5

Figure 6:
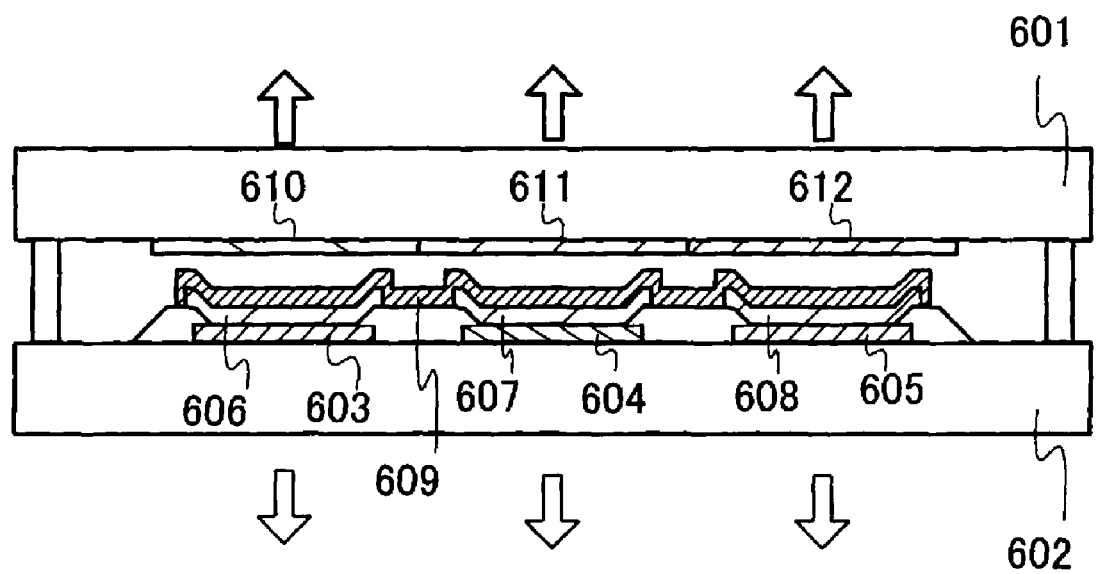
FIG. 6 is a diagram showing a concept of both sides light-emitting display panels used for a cell-phone described in Embodiment Mode 4.

FIG. 6 shows a concept of a both sides light-emitting display panel used for the cell-phone of Embodiment Mode 4. In FIG. 6, transparent electrodes or an electrode 603, an electrode 604, an electrode 605 and an electrode 609 equivalent to those exist between two transparent substrates 601 and 602, and an EL layer 606, an EL layer 607 and an EL layer 608 developing electroluminescence are sandwiched between these electrodes. A color filter 610, a color filter 611 and a color filter 612 are placed on the transparent substrate 601, and in the case where the EL layer 606, the EL layer 607 and the EL layer 608 are for white light emission, full color display on a first light-emitting surface and white display on a second light-emitting surface are possible. Colors may be separately applied to the luminous bodies, without using the color filters. In this case, the color which can be displayed on the first light-emitting surface and the second light-emitting surface is the same.

Embodiment Mode 6

Figure 7:
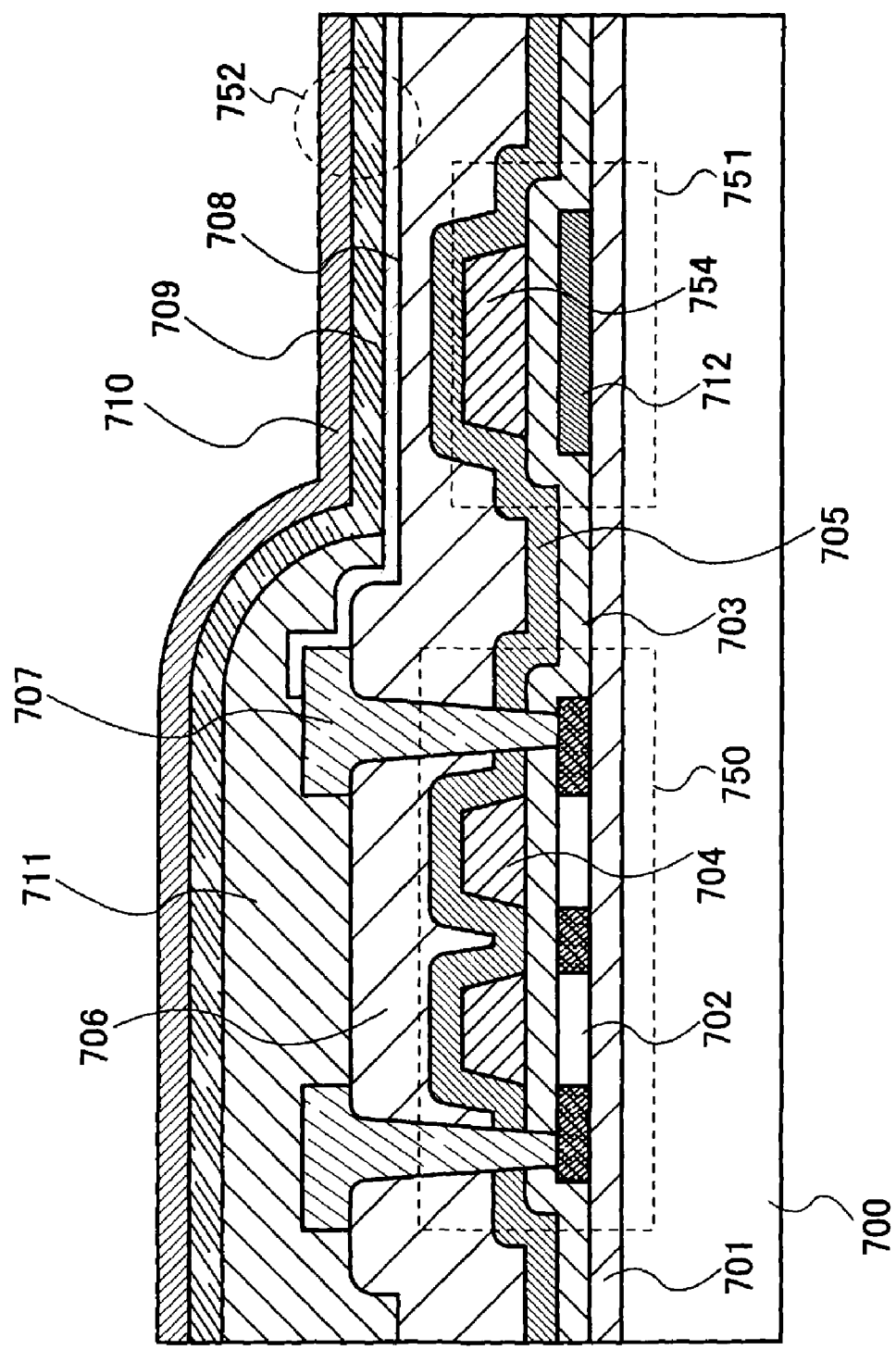
FIG. 7 is a diagram showing an embodiment of a pixel structure of a display device described in Embodiment Modes 1 to 5.

A mode of a pixel structure of the display device shown in Embodiment Modes 1 to 5 will be described, referring to FIG. 7. FIG. 7 is a cross-sectional view of a pixel constituted by a thin film transistor (TFT) and a light-emitting element connected to that.

In FIG. 7, a blocking layer 701, a semiconductor layer 702 constituting a TFT 750, a semiconductor layer 712 constituting one of electrodes of a capacitance part 751 are formed over a substrate 700. Over these layers, a first insulating layer 703 is formed, and it functions as a gate insulating layer for the TFT 750, and as a dielectric layer forming capacitance for the capacitance part 751.

On the first insulating layer 703, a gate electrode 704 and a conductive layer 754 forming the other electrode of the capacitance part 751 are formed. A wiring 707 connected to the TFT 750 is connected to a first electrode 708 of a light-emitting element 752. The first electrode 708 is formed on a third insulating layer 706. A second insulating layer 705 may be formed between the first insulating layer 703 and the third insulating layer 706. A light-emitting element 752 is constituted by the first electrode 708, an EL layer 709 and a second electrode 710. Furthermore, a fourth insulating layer 711 is formed so as to cover a peripheral edge of the first electrode 708 and a connection of the first electrode 708 and a wiring 707.

Next, the details of the structure shown above will be described. As the substrate 700, a glass substrate such as a barium borosilicate glass and an alumino-borosilicate glass, a quartz substrate, a ceramic substrate or the like can be used. In addition, a metal substrate including stainless-steel or a semiconductor substrate with an insulating film formed on the surface may be used. A substrate formed of a synthetic resin having flexibility such as a plastic may be used. The surface of the substrate 700 may be planarized by polishing such as chemical mechanical polishing (CMP).

As a blocking layer 701, an insulating film such as silicon oxide, silicon nitride and silicon nitride oxide can be used. By the blocking layer 701, an alkali metal such as Na and an alkaline earth metal contained in the substrate 700 can be prevented from diffusing into the semiconductor layer 702 and having negative effects on the characteristics of the TFT 750. Although the blocking film 701 has a monolayer structure in FIG. 7, it can be formed of two layers or more layers. In the case where a substrate having no problem of impurity diffusion, such as a quartz substrate, is used, the blocking layer 701 is not necessarily provided.

Furthermore, a surface of the glass substrate may be treated directly by dense plasma of which the electron temperature is 2 eV or less, the ion energy is 5 eV or less, and the electron density is approximately from $1 \times 10^{11}$ to $5 \times 10^{13}$/cm$^3$, that is excited by a microwave. For generating plasma, plasma treatment equipment of microwave excitation using a radial slot antenna can be used. At this time, when nitrogen ($N_2$), or a nitride gas such as ammonia ($NH_3$) and nitrous oxide ($N_2O$) is introduced, the surface of the glass substrate can be nitride. Since the major component of a nitride layer formed on the surface of the glass substrate is silicon nitride, it can be used as a blocking layer of an impurity diffused from the glass substrate side. A silicon oxide film or a silicon oxynitride film may be formed on the nitride layer by plasma CVD so as to be a blocking layer 701.

Besides, by performing the same plasma treatment to a surface of the blocking layer 701 of silicon oxide or silicon oxynitride, the surface and 1 to 10 nm deep from the surface can be treated for nitriding. By this extremely thin layer of silicon nitride, a blocking layer which does not have an effect of stress on a semiconductor layer formed thereon can be made.

As the semiconductor layer 702 and the semiconductor layer 712, it is preferable to use crystalline semiconductor films divided into islands. A crystalline semiconductor film can be obtained by crystallizing an amorphous semiconductor film. As a method for crystallization, a laser crystallization method, a thermal crystallization method using an RTA or an annealing furnace, a thermal crystallization method using a metal element helping crystallization, or the like can be used. The semiconductor layer 702 has a channel forming region and a pair of impurity regions to which an impurity element giving one conductivity type is added. An impurity region to which the impurity element is added at low concentration may be provided between the channel forming region and the pair of impurity regions. The semiconductor layer 712 can have a structure in which an impurity element giving one conductivity type or the other conductivity type is added over all.

As the first insulating layer 703, silicon oxide, silicon nitride, or a silicon nitride oxide is used, and it can be formed of a single layer, or by laminating a plurality of films. In this case, in the same way as the above-described case, a surface of the insulating film may be treated for oxidizing or nitriding by a dense plasma treatment of which the electron temperature is 2 eV or less, the ion energy is 5 eV or less, and the electron density is approximately from $1 \times 10^1$ to $5 \times 10^{13}$/cm$^3$, that is excited by a microwave, so that the surface becomes dense. This treatment may be performed before forming the first insulating layer 703. That is, a plasma treatment is performed to a surface of the semiconductor layer 702. At that time, by setting the substrate temperature at from 300 to 450° C. and performing the treatment in an oxidative atmosphere ($O_2$, $N_2O$ or the like) or in a nitriding atmosphere ($N_2$, $NH_3$ or the like), a good interface with the gate insulating layer to be deposited thereon can be formed.

As the gate electrode 704 and the conductive layer 754, a single layer or laminated structure formed of an alloy or a compound including one kind of element selected from Ta, W, Ti, Mo, Al, Cu, Cr and Nd, or a plurality of the elements can be used.

The TFT 750 is constituted by the semiconductor layer 702, the gate electrode 704, and the first insulating layer 703 between the semiconductor layer 702 and the gate electrode 704. In FIG. 7, as the TFT 750 constituting a pixel, a TFT which is connected to the first electrode 708 of the light-emitting element 752 is shown. This TFT 750 has a structure of a muligate type in which a plurality of gate electrodes 704 are placed over the semiconductor layer 702. That is, it has a structure in which a plurality of TFTs are connected in series. By a structure like this, the unconsidered increase of an off current can be restrained. Although the TFT 750 is shown as a top-gate TFT in FIG. 7, it may be a bottom-gate TFT which has a gate electrode under a semiconductor layer, or a dual-gate TFT which has gate electrodes above and under a semiconductor layer.

A capacitance part 751 is constituted by the first insulating film 703 as a dielectric, and the semiconductor layer 712 and the conductive layer 754 opposing to each other sandwiching the first insulating film 703, as a pair of electrodes. In FIG. 7, an example where one of the pair of electrodes is the semiconductor layer 712 which is formed simultaneously with the semiconductor layer 702 of the TFT 750 and the other conductive layer 754 is a layer formed simultaneously with the gate electrode 704 is shown, but not limited to this.

It is preferable that the second insulating layer 705 is an insulating film with a barrier property blocking an ionic impurity, such as a silicon nitride film. The second insulating layer 705 is formed of silicon nitride, or silicon oxynitride. The second insulating layer 705 includes a function as a protective film preventing contamination of the semiconductor layer 702. After depositing the second insulating layer 705, a high-density plasma treatment exited by a microwave as described above may be performed, introducing a hydrogen gas, so that the second insulating layer 705 is hydrogenated. Or the second insulating layer 705 may be nitrided and hydrogenated, by introducing an ammonia gas. Or an oxidation nitriding treatment and a hydrogen treatment may be performed, by introducing oxygen, an $N_2O$ gas or the like, and a hydrogen gas. By performing the nitriding treatment, the oxidation treatment, or the oxidation nitriding treatment, in this way, a surface of the second insulating layer 705 can be dense. By this, a function as a protective film can be reinforced. As for hydrogen introduced to the second insulating layer 705, by performing a heat treatment of from 400 to 450° C., hydrogen is released from silicon nitride forming the second insulating layer 705, and hydrogenation of the semiconductor layer 702 can be performed.

As the third insulating layer 706, an inorganic insulating film or an organic insulating film can be used. As the inorganic insulating film, a silicon oxide film formed by CVD, an SOG (Spin On Glass) film (coated silicon oxide film) or the like can be used. As the organic insulating film, a film of polyimide, polyamide, BCB (benzocyclobutene), acrylic or positive type photosensitive organic resin, negative type photosensitive organic resin or the like can be used. In addition, as the third insulating layer 706, a material of which the skeleton structure is constituted by a binding of silicon (Si) and oxygen (O) can be used. As a substituent of this material, an organic group including at least hydrogen (an alkyl group and aromatic hydrocarbon, for example) is used. A fluoro group can be used as a substituent. Or an organic group including at least hydrogen and a fluoro group can be used as a substituent.

As the wiring 707, a single layer or a laminated structure formed of an alloy including one kind of element selected from Al, Ni, C, W, Mo, Ti, Pt, Cu, Ta, Au and Mn, or a plurality of the elements can be used.

Either one of the first electrode 708 and the second electrode 710, or both of them can be made as transparent electrodes. As the transparent electrode, indium oxide including tungsten oxide, indium oxide-zinc oxide including tungsten oxide, indium oxide-tin oxide including titanium oxide, indium oxide-tin oxide including molybdenum or the like can be used. Of course, indium oxide-tin oxide, indium oxide-zinc oxide, indium oxide-tin oxide with silicon oxide added, or the like can be also used.

At least one of the first electrode 708 and the second electrode 710 may be formed of a material having no transparency. For example, an alkali metal such as Li and Cs, an alkali earth metal such as Mg, Ca and Sr, an alloy including these (Mg: Ag, Al: Li, Mg: In or the like), an compound of these ($CaF_2$), or a rare-earth metal such as Yb and Er can be used.

The fourth insulating layer 711 can be formed using the same material as the third insulating layer 706.

The light-emitting element 752 is constituted by an EL layer 709, the first electrode 708 and the second electrode 710 sandwiching the EL layer 709. One of the first electrode 708 and the second electrode 710 corresponds to a positive electrode, and the other corresponds to a negative electrode. When a voltage larger than a threshold voltage is applied with a forward bias between the positive electrode and the negative electrode, a current flows from the positive electrode to the negative electrode and the light-emitting element 752 emits light.

The EL layer 709 is constituted by a single layer or a plurality of layers. In the case where it is constituted by a plurality of layers, the layers can be classified into a hole injection layer, a hole transport layer, a light-emitting layer, an electron transport layer, an electron injection layer and the like, depending on the carrier transport properties. The boundary between each layer is not necessarily clear, and there is a case where the interface is unclear since materials structuring each layer are mixed partly. Organic materials and inorganic materials can be used for each layer. Any material of a polymer system, a middle-molecule system and a low molecular system can be used as the organic material.

It is preferable that the EL layer 709 is constituted using a plurality of layers having different functions, such as a hole injection and transport layer, a light-emitting layer and an electron injection and transport layer. It is preferable that the hole injection and transport layer is formed of composite materials including an organic compound material having a hole transport property and an inorganic compound material showing an electron-accepting property to the organic compound material. Due to a structure like this, many hole carriers are generated in an organic compound which originally has almost no internal carrier, and an extremely good hole injection property and transport property is obtained. By this effect, a driving voltage can be lower than a conventional case. In addition, the hole injection and transport layer can be thickened without causing increase in the driving voltage, so that short-circuiting of the light-emitting element due to dust or the like can be restrained.

As the organic compound material having a hole transport property, copper phthalocyanine (the abbreviation: CuPc), 4,4',4"-tris[N-(3-methylphenyl)-N-phenylamino]triphenylamine (the abbreviation: MTDATA), 1,3,5-tris[N,N-di(m-tolyl)amino]benzene (the abbreviation: m-MTDAB), N,N'-diphenyl-N,N'-bis(3-methylphenyl)-1,1'-biphenyl-4,4'-diamine (the abbreviation: TPD), 4,4'-bis[N-(1-naphthyl)-N-phenylamino]biphenyl (the abbreviation: NPD), 4,4'-bis{N-[4-di(m-tolyl)amino]phenyl-N-phenylamino}biphenyl (the abbreviation: DNTPD) and the like can be cited as the examples, but not limited to these.

As the inorganic compound material showing an electron-accepting property, titanium oxide, zirconium oxide, vanadium oxide, molybdenum oxide, tungsten oxide, rhenium oxide, ruthenium oxide, zinc oxide and the like can be cited as the example. Especially vanadium oxide, molybdenum oxide, tungsten oxide and rhenium oxide are preferable, since vacuum deposition is possible and they are easy to deal with.

The electron injection and transport layer is formed by using an organic compound material having an electron transport property. Specifically, tris(8-quinolinolato)aluminum (the abbreviation: $Alq_3$), tris(4-methyl-8-quinolinolato)aluminum (the abbreviation: Almq$_3$), bis(2-methyl-8-quinolinolato)(4-phenylphenolato)aluminum (the abbreviation: BAlq), bathocuproin (the abbreviation: BCP), 2-(4-biphenyl)-5-(4-tert-butylphenyl)-1,3,4-oxadiazole (the abbreviation: PBD), 3-(4-biphenylyl)-4-phenyl-5-(4-tert-butylphenyl)-1,2,4-triazole (the abbreviation: TAZ) and the like can be cited, but not limited to these.

As the EL layer, 9,10-di(2-naphthyl)anthracene (the abbreviation: DNA), 9,10-di(2-naphthyl)-2-tert-butylanthracene (the abbreviation: t-BuDNA), 4,4'-bis(2,2-diphenylvinyl)biphenyl (the abbreviation: DPVBi), coumarin 30, coumarin 6, coumarin 545, coumarin 545T, rubrene, 2,5,8,11-tetra(tert-butyl)perylene (the abbreviation: TBP), 9,10-diphenylanthracene (the abbreviation: DPA), 5,12-diphenyltetracene, 4-(dicyanomethylene)-2-methyl-[p-(dimethylamino)styryl]-4H-pyran (the abbreviation: DCM1), 4-(dicyanomethylene)-2-methyl-6-[2-(julolidine-9-yl)ethenyl]-4H-pyran (the abbreviation: DCM2) and the like can be cited. In addition, a compound which can emit phosphorescence such as bis{2-[3',5'-bis(trifluoromethyl)phenyl]pyridinato-N,C$^{2'}$}iridium (picolinate) (the abbreviation: Ir(CF$_3$ppy)$_2$(pic)), tris(2-phenylpyridinate-N,C$^{2'}$)iridium (the abbreviation: Ir(ppy)$_3$), bis(2-phenylpyridinate-N,C$^{2'}$)iridium(acetylacetonato) (the abbreviation: Ir(ppy)$_2$(acac)), bis[2-(2'-thienyl)pyridinato-N, C$^{3'}$]iridium(acetylacetonato) (the abbreviation: Ir(thp)$_2$(acac)), bis(2-phenylquinolinate-N, C$^{2'}$)iridium(acetylacetonato) (the abbreviation: Ir(pq)$_2$(acac)) can be also used.

In addition, a singlet excited luminescence material and a triplet excited luminescence material including a metal complex or the like may be used for the EL layer. For example, of a pixel for red light emission and a pixel for green light emission and a pixel for blue light emission, the pixel for red light emission of which the time of luminance reduction by half is relatively short is formed of the triplet excited luminescence material, and the others are formed of the singlet excited luminescence material. Since the luminous efficiency of the triplet excited luminescence material is good, lower power consumption is needed to obtain the same luminance. That is, when applied to the red pixel, a smaller amount of the current flown to the light-emitting element is needed, so that the reliability can be improved. For lower power consumption, the pixel for red light emission and the pixel for green light emission may be formed of the triplet excited luminescence material and the pixel for blue light emission may be formed of the singlet excited luminescence material. By forming the green light-emitting element for which human visibility is high also by the triplet excited luminescence material, the power consumption can be further reduced.

The EL layer may have a structure in which light-emitting layers with different emission wavelengths are formed for each pixel so that color display is performed. Typically, light-emitting layers corresponding to colors of R (red), G (green) and B (blue) respectively are formed. In this case, by making a structure where a filter which transmits light of the emission wavelength is provided on the light emission side of the pixel, color purity can be improved, and the pixel part can be prevented from becoming a mirror surface (reflective). By providing the filter, a circularly polarizing plate which is conventionally necessary can be omitted, and it becomes possible that there is no loss of light emitted from the light-emitting layer. Furthermore, change in the color tone which occurs when the pixel part (the display screen) is seen from an oblique direction can be decreased.

By combining the pixel with the structure shown in FIG. 7 and an external light strength detector, light-emitting time of the light-emitting element is changed and the luminance of the display screen can be controlled. Furthermore, by controlling light emission of the light-emitting element by the external light strength detector, the lighting time does not increase uselessly, so that power consumption of the display panel can be decreased and the lifetime can be extended.

Embodiment Mode 7

The light sensor which detects external light strength may be incorporated into the display device. The light sensor may be mounted on the display device as a part, or may be formed being united with the display panel. In the case where it is formed being united with the display panel, the display surface can be used as an acceptance surface of the light sensor also, which has a great effect in design. That is, grayscale control based on the external light strength can be performed without making users conscious of the light sensor attached to the display device.

Figure 8:
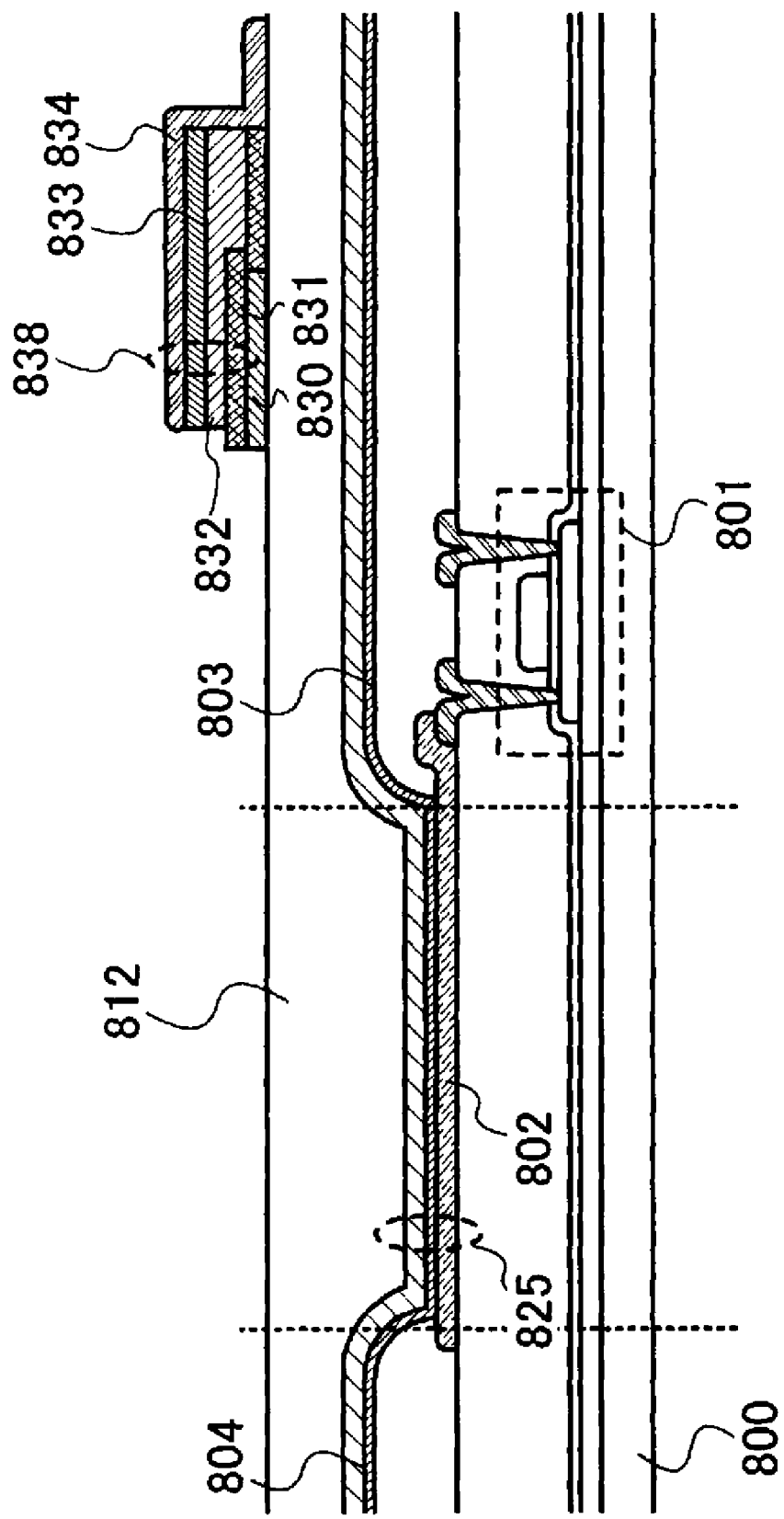
FIG. 8 is a diagram showing an embodiment in which a light sensor is formed united on a display panel.

FIG. 8 is a diagram showing a mode in which the light sensor is formed united on the display panel. In FIG. 8, the case where a pixel is constituted by a light-emitting element for light-emission of electroluminescence and a TFT which controls the operation of the light-emitting element is shown.

In FIG. 8, a driving TFT 801 formed on a substrate 800 having transparency, a first electrode 802 (a pixel electrode) formed of a transparent material, an EL layer 803 and a second electrode 804 (an opposing electrode) formed of a transparent material are provided. A light-emitting element 825 emits light upward (the arrow direction). And over an insulating film 812 formed on the second electrode 804, a photoelectric conversion element 838 formed of a laminated body of a p-type layer 831, an i-type layer 832 which is virtually intrinsic and an n-type layer 833, a p-layer side electrode 830 connected to the p-type layer 831, and an n-layer side electrode 834 connected to the n-type layer 833 are provided.

In the present embodiment, the photoelectric conversion element 838 is used as a light sensor element. The light-emitting element 825 and the photoelectric conversion element 838 are formed over the same substrate 800, and the light emitted from the light-emitting element 825 constitutes video, and the user sees it. On the other hand, the photoelectric conversion element has functions of detecting external light and sending the detection signal to a controller. In this way, the light-emitting element and the light sensor (the photoelectric conversion element) can be formed over the same substrate, which contributes to miniaturization of the set.

Embodiment Mode 8

Figure 9:
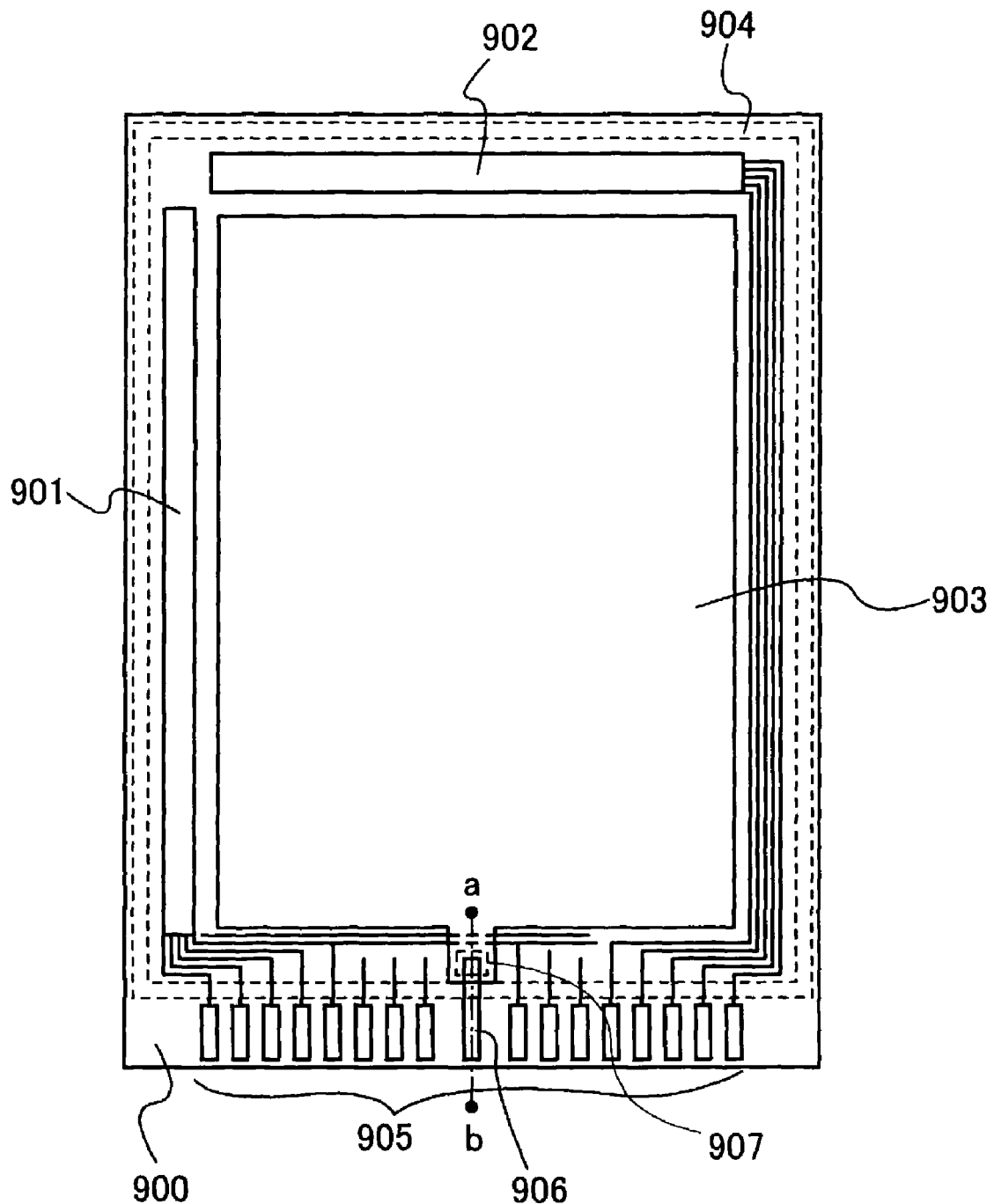
FIG. 9 is a diagram showing a structure of a display region, a driving circuit and a terminal part of a display panel of the invention.

A constitution of a display panel provided with a structure of any one of Embodiments 1 to 7, or the combination of these is shown in FIG. 9. On a substrate 900, a gate line driving circuit 901, a data line driving circuit 902, an opposing electrode 903 and a connecting terminal part 905 are provided. A sealing region 904 is a region for gluing the substrate 900 and an opposing substrate together. So, when the substrate 900 and the opposing substrate are glued together at the sealing region, the gate line driving circuit 901, the data line driving circuit 902 and the opposing electrode 903 are encapsulated by the substrate 900, the opposing substrate and a sealing material.

Under the opposing electrode 903, a plurality of source lines extended in the column direction from the data line driving circuit 902 are arranged lined up in a row direction. In addition, a plurality of gate lines extended in the row direction from the gate line driving circuit 901 are arranged lined up in a column direction. In addition, corresponding to the source lines and the data lines, a plurality of pixels including the display elements are arranged in a matrix.

The display element includes various types such as an EL element (an organic EL element, an inorganic EL element or an EL element including an organic material and an inorganic material), an element used for a field emission display (FED), an SED (Surface-conduction Electron-emitter Display) which is a type of FED, a liquid crystal display (LCD), a plasma display (PDP), an electronic paper display, a digital micromirror device (DMD) and a piezoceramic display.

Furthermore, a plurality of connecting terminals are arranged on the connecting terminal part 905 formed on the substrate. These connecting terminals are for making connection with an external circuit so that a signal and power inputted from outside is supplied to the circuit formed on the substrate 900. The circuit formed on the substrate 900 includes not only a circuit constituted by a thin film transistor formed simultaneously with a thin film transistor (also referred to as TFT) which the pixel has and the like, of course, but also a circuit formed on an IC chip and mounted on the substrate 900 by COG (Chip On Glass). An IC chip means an integrated circuit formed on a substrate and separated into chips. Especially, as an IC chip, a chip formed by using a single crystal silicon wafer as a substrate and forming circuits by element isolating or the like, then separating the single crystal silicon wafer into arbitrary shapes is suitable. In addition, an FPC (Flexible Print Circuit), for example, or the like is electrically connected to the connecting terminal part 905 for connection with an external circuit.

By the wiring connected to the connecting terminal, a signal and power is supplied to the data line driving circuit 902 and the gate line driving circuit 901, and power is supplied to the pixel electrode and the opposing electrode.

Here, as for a display device of the embodiment, the data line driving circuit 902 is formed on the opposite side of the connecting terminal part 905, sandwiching the opposing electrode 903 therebetween. That is, the data line driving circuit 902 is not placed between the connecting terminal part 905 and the opposing electrode 903. Therefore, a wiring extended from a connecting terminal 906 to which a power-supply potential to be inputted to the opposing electrode 903 is inputted is connected to the opposing electrode 903 without crossing the data line driving circuit, through a contact hole 907.

That means, according to this structure, the opposing electrode 903 does not cross over the data line driving circuit 902, so that a parasitic capacitance generated by the opposing electrode 903 and the data line driving circuit overlapping each other can be prevented.

Furthermore, when the connecting terminal 906 and the opposing electrode 903 are connected to each other slipping through the data line driving circuit 902 by a multilayer interconnection structure, increase in the contact resistance between wirings is caused. However, according to the present constitution, the connecting terminal 906 and the opposing electrode 903 can be connected to each other without making the multilayer interconnection structure, so that the resistance can be decreased. In addition, since the distance between the connecting terminal 906 and the opposing electrode 903 is short, the wiring resistance can be decreased, too.

Figure 10A:
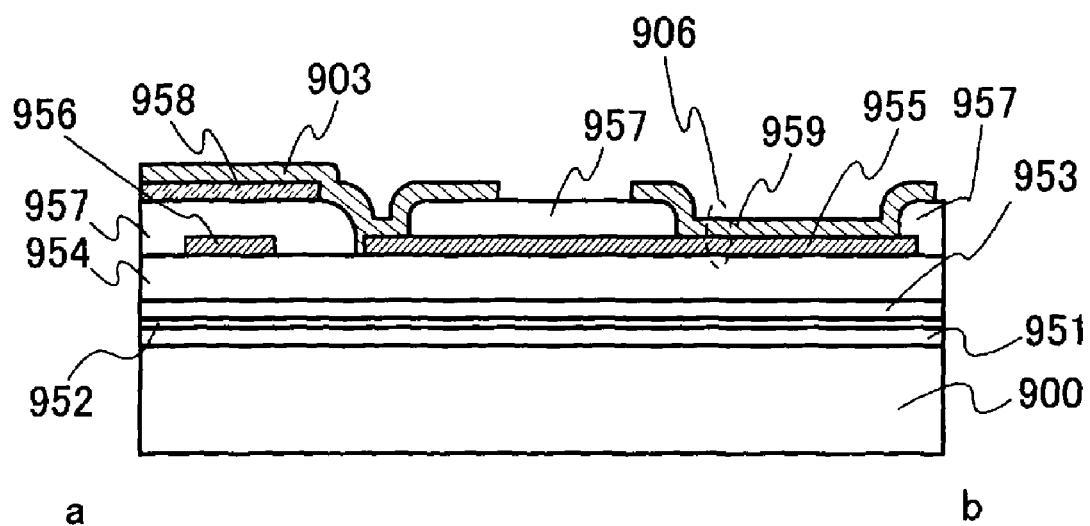
FIGS. 10A and 10B are diagrams showing a structure of a display region, a driving circuit and a terminal part of a display panel of the invention.

Next, for describing the connection between the connecting terminal 906 and the opposing electrode 903 in more detail, a cross-sectional view of the line a-b of FIG. 9 is used and described. FIG. 10A is a diagram showing an example of the cross-sectional view of the line a-b of FIG. 9.

On a substrate 900, a base layer 951 is provided. As the substrate 900, an insulating substrate such as a glass substrate, a quartz substrate, a plastic substrate and a ceramic substrate, a metal substrate, a semiconductor substrate or the like can be used.

The base layer 951 can be formed by CVD or sputtering. For example, a silicon oxide film, a silicon nitride film and a silicon nitride oxide film formed by CVD using $SiH_4$, $N_2O$ and $NH_3$ as materials, and the like can be applied. Furthermore, a lamination layer of these may be used. The base layer 951 is provided for preventing an impurity from diffusing from the substrate 900 into a semiconductor layer So, when a glass substrate or a quartz substrate is used as the substrate 900, the base layer 951 need not be provided.

On the base layer 951, a gate insulating film 952 is provided. As the gate insulating film 952, a silicon oxide film, a silicon nitride film and a silicon nitride oxide film formed by CVD or sputtering, and the like can be used.

On the gate insulating film 952, an interlayer insulating film is provided. The interlayer insulating film has an under layer insulating film 953 and an upper layer insulating film 954. As the under layer insulating film 953, an inorganic insulating film can be applied, for example. As the inorganic insulating film, a silicon nitride film, a silicon oxide film and a silicon nitride oxide film, or a film formed by laminating these can be used. In addition, as the upper insulating film, an inorganic insulating film or a resin film can be applied. As the inorganic insulating film, the above-described films can be used, and as the resin film, polyimide, polyamide, acrylic, polyimideamide, epoxy and the like can be used.

On the interlayer insulating film, a wiring 955 and a wiring 956 are provided. The wiring 955 and the wiring 956 are formed in the same layer by conductive films of the same material. As the material, a titanium (Ti) film, an aluminum (Al) film, a copper (Cu) film, an aluminum film containing Ti, and the like can be used. More preferably, the wiring 955 and the wiring 956 have a trilaminar structure in which a titanium (Ti) film is the under layer, an aluminum (Al) film is thereon, and a titanium (Ti) film is further thereon is used.

The wiring 955 corresponds to the connecting terminal 906 in FIG. 9. Furthermore, the wiring 956 corresponds to a wiring in a sealing region 904. And, wirings in the sealing region 904 of this layer, formed of the same material, include a wiring contacting with an impurity region of the transistor.

In addition, on the wiring 956 and the wiring 955, an insulating layer 957 is formed. For example, a positive-type photosensitive acrylic resin film can be used as the insulating layer 957.

In addition, on the insulating layer 957, an EL layer 958 is provided. In addition, on the EL layer 958, an opposing electrode 903 and a connection electrode 959 are provided. The insulating layer 957 has a contact hole, and the opposing electrode 903 is connected to the wiring 955 through the contact hole. Furthermore, the connection electrode 959 is also connected to the wiring 955. So, the connecting terminal 906 is constituted by a part of the wiring 955 and the connection electrode 959, and the connection electrode 959 corresponds to a connection pad of the connecting terminal 906.

The structure shown in FIG. 9 is preferably applied to a display panel of which the screen size is approximately from 1 to 3 inches, especially.

Figure 10B:
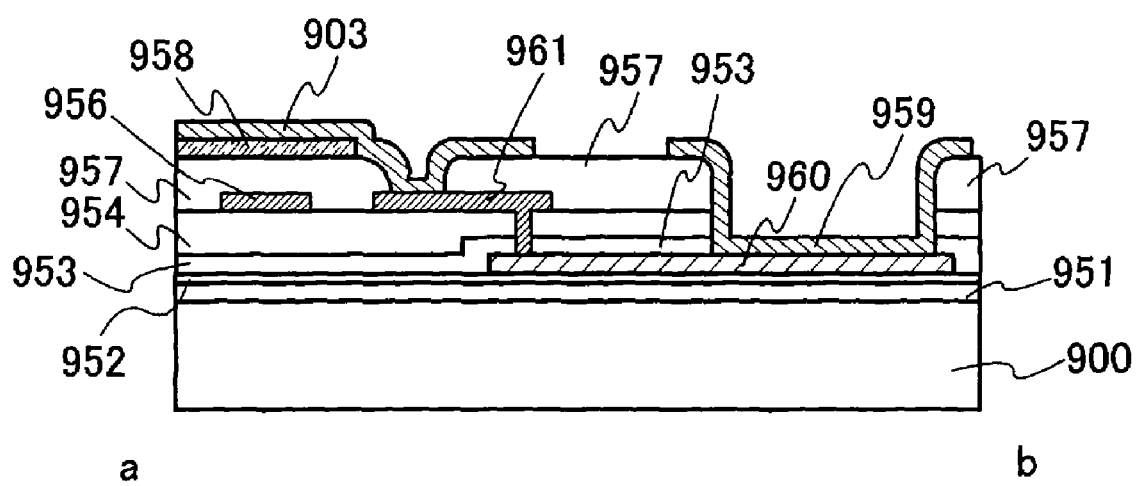

The above-described cross-sectional view 10A is an example, and not limited to this. The other structure is shown in FIG. 10B. Here, substances in common with FIG. 10A are indicated by the same numerals, and the explanation is omitted.

A structure of FIG. 10B has a wiring 960 on a gate insulating film 952. The wiring 960 corresponds to a part of the connecting terminal 906 in FIG. 9 and a wiring extended from the connecting terminal 906. And, wirings in the sealing region, which are formed of the same material as the wiring 960 in the same layer, include a wiring constituting a gate electrode of a transistor.

Over the wiring 960, interlayer insulating films (an under layer insulating film 953 and an upper layer insulating film 954 ) are provided. And, on the upper layer insulating film 954, a wiring 956 and a wiring 961 are provided, and the wiring 961 is connected to the wiring 960 through a contact hole. In addition, the wiring 956 corresponds to a wiring in the sealing region 904. And, wirings in the sealing region 904, which are formed of the same material in this layer, include a wiring contacting with an impurity region of a transistor.

Furthermore, on the wiring 956, the wiring 961 and the upper layer insulating film 954, an insulating layer 957 is provided. And on the insulating layer 957 and in the sealing region, an EL layer 958 is formed. And on the EL layer 958 and the insulating layer 957 in the sealing region, an opposing electrode 903 is formed. In addition, on the insulating layer 957 of the connecting terminal part, a connection electrode 959 is formed. The opposing electrode 903 in the sealing region is connected to the wiring 961 through a contact hole, and the connection electrode 959 of the connecting terminal part is connected to the wiring 960 through a contact hole.

At this time, the connecting terminal 906 is constituted by a part of the wiring 960 and the connection electrode 959, and the connection electrode 959 corresponds to a connection pad of the connecting terminal 906.

The structure of a display panel shown in FIG. 9 and FIGS. 10A and 10B has a pixel region made by an EL element formed on an insulating substrate. An upper electrode as one of electrodes of the EL element is electrically connected to one terminal in a terminal group provided on the opposite side of the data line driving circuit, which is placed in the center or closed to the center. By such a structure, influence of resistance loss due to the upper electrode or the lead wiring does not concentrate on one side of the display panel, so that unevenness of luminance in the pixel region can be reduced.

Figure 11:
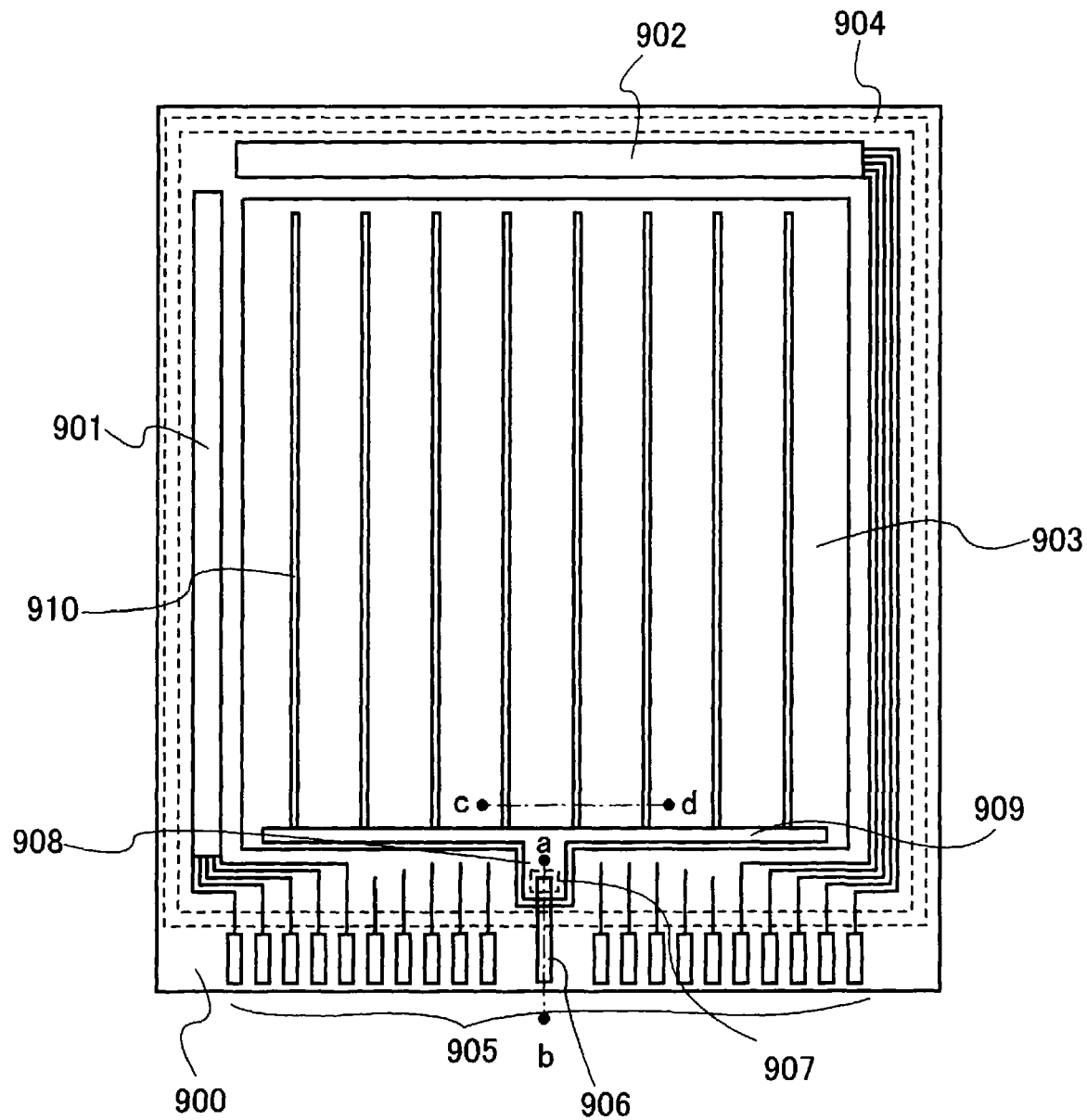
FIG. 11 is a diagram showing a structure of a display region, a driving circuit and a terminal part of a display panel of the invention.

FIG. 11 is a view showing the second structure of the embodiment. In the structure of FIG. 11, substances in common with the structure of FIG. 9 are indicated by the same numerals and the explanation will be omitted. In the present structure, a gate line driving circuit 901, a data line driving circuit 902, an opposing electrode 903 and a connecting terminal part 905 are provided on a substrate 900. And a sealing region 904 is a region for gluing the substrate 900 and an opposing substrate together. So, when the substrate 900 and the opposing substrate are glued together at the sealing region, the gate line driving circuit 901, the data line driving circuit 902 and the opposing electrode 903 are encapsulated by the substrate 900, the opposing substrate and a sealing material.

This structure has auxiliary wirings on an opposing electrode. The auxiliary wirings include a first broad wiring 908, a second broad wiring 909, and a plurality of branch wirings 910, and these are constituted by a stretch of conductive film. The first broad wiring 908 is connected to a wiring extended from a connecting terminal 906, through a contact hole 907. It is preferable that the width of the first broad wiring 908 is larger than the wiring extended from the connecting terminal 906. In addition, it is preferable that the length of the second broad wiring 909 is roughly the same as the length of the row direction where pixels of the pixel part are placed. And the number of branch wirings 910 is preferably the same as the number of pixel columns.

Figure 12A:
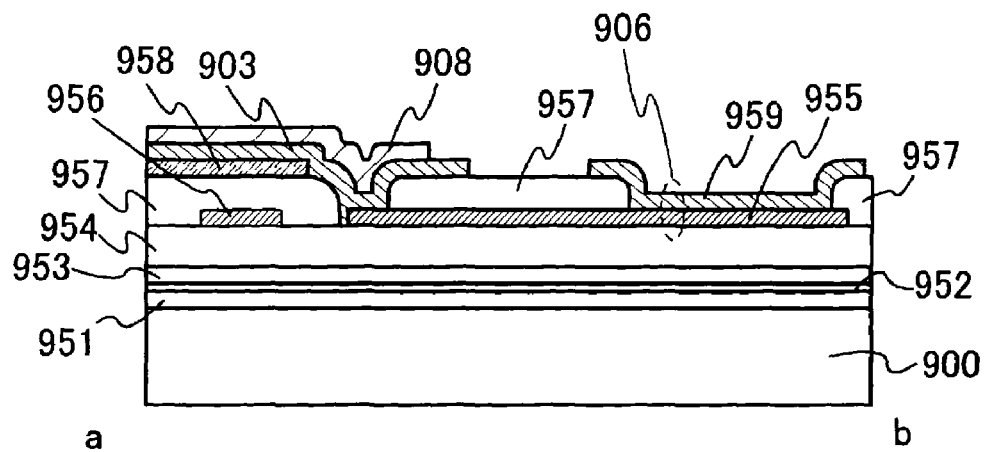
FIGS. 12A, 12B and 12C are diagrams showing a structure of a display region, a driving circuit and a terminal part of a display panel of the invention.

Next, a cross-sectional view at the line a-b of FIG. 11 is shown in FIG. 12A. Substances in common with the structure of FIGS. 10A and 10B are indicated by the same numerals, and the description will be omitted. The present structure has a first broad wiring 908 on an opposing electrode 903.

Figure 12B:
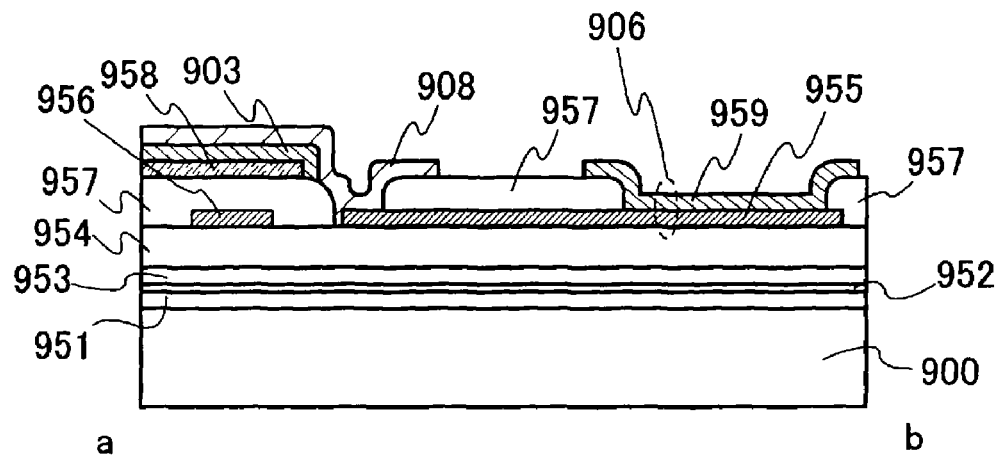

The structure shown in FIG. 12A is an example, and not limited to this. So, it may be a structure shown in FIG. 12B. In FIG. 12B, a first broad wiring 908 formed on an opposing electrode 903 contacts with a wiring 955 through a contact hole so that an opposing electrode 903 and a connecting terminal 906 are electrically connected to each other.

Figure 12C:
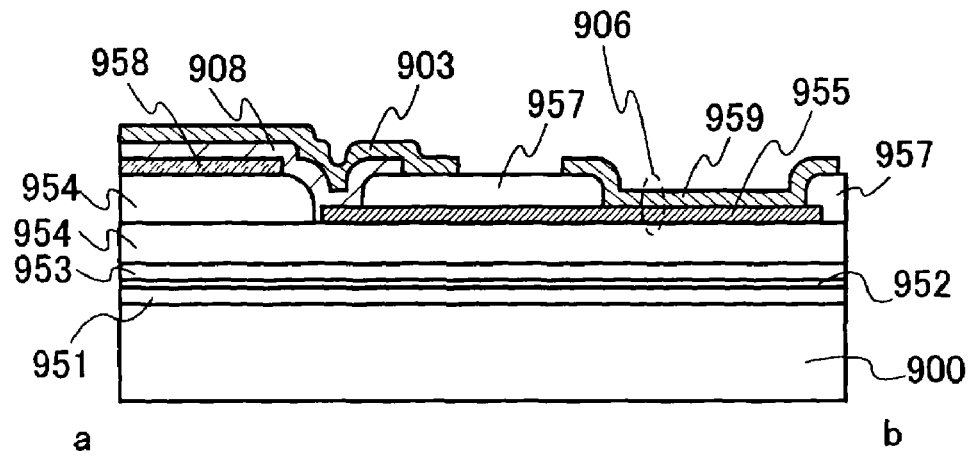

Furthermore, another structure is shown in FIG. 12C. In the case of FIG. 12C, a first broad wiring 908 is provided on an EL layer 958, and an opposing electrode 903 is formed on the first broad wiring 908.

Figure 15:
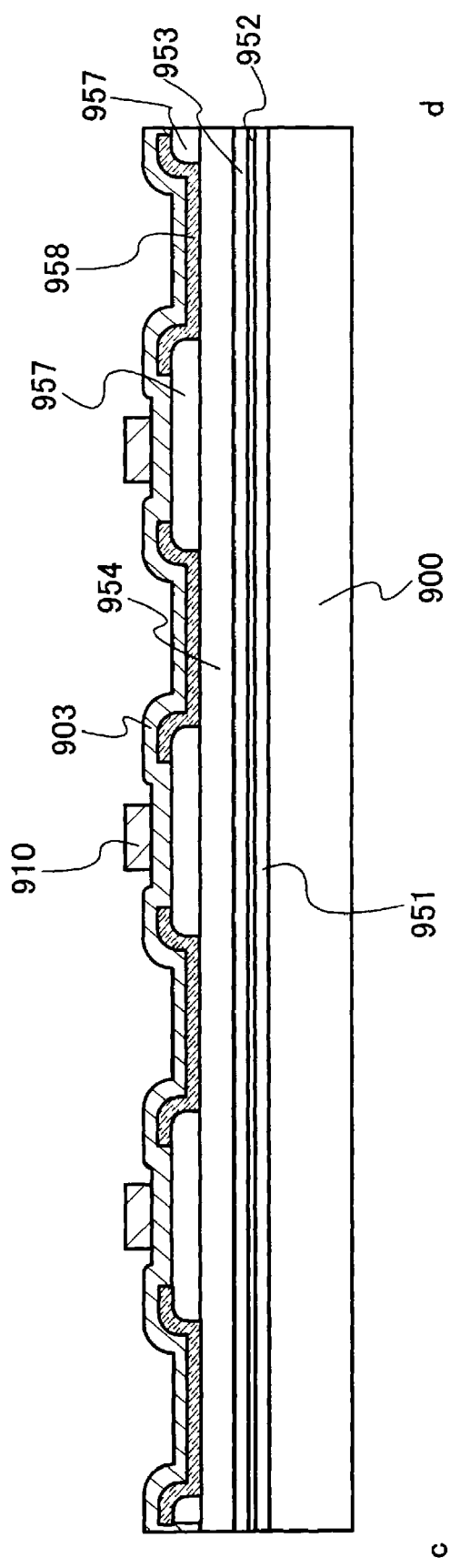
FIG. 15 is a diagram showing a structure of a display region, a driving circuit and a terminal part of a display panel of the invention.

Furthermore, an example of a cross section at the line c-d of FIG. 11 in the case of the structure of FIG. 12A and FIG. 12B is shown in FIG. 15. Substances in common with the structure of FIG. 12A and FIG. 12B are indicated by the same numerals, and the explanation will be omitted. In FIG. 15 also, a base layer 951 is provided on a substrate 900, a gate insulating film 952 is provided thereon, an under insulating film 953 is provided thereon, and an upper insulating film 954 is provided further thereon.

And on the upper insulating film 954, an insulating layer 957 is provided, and an EL layer 958 formed on the insulating layer 957 is isolated from each other on the insulating layer 957.

Furthermore, on the insulating layer 957 and the EL layer 958, an opposing electrode 903 is provided. Over the insulating layer 957, a branch wiring 910 is provided, sandwiching the opposing electrode 903 therebetween. So, this structure is especially suitable for the case where a conductive film such as ITO is used as the opposing electrode and upper surface emission which emits light from the opposite side of the substrate 900 is adopted. Because, by connecting the opposing electrode 903 to the branch wiring 910, the resistance can be reduced. In addition, the branch wiring 910 does not disturb light emission, since it is over the insulating layer 957.

The structure shown in FIG. 11 is preferably applied to a display panel of which the screen size is approximately from 3 to 10 inches.

Figure 16:
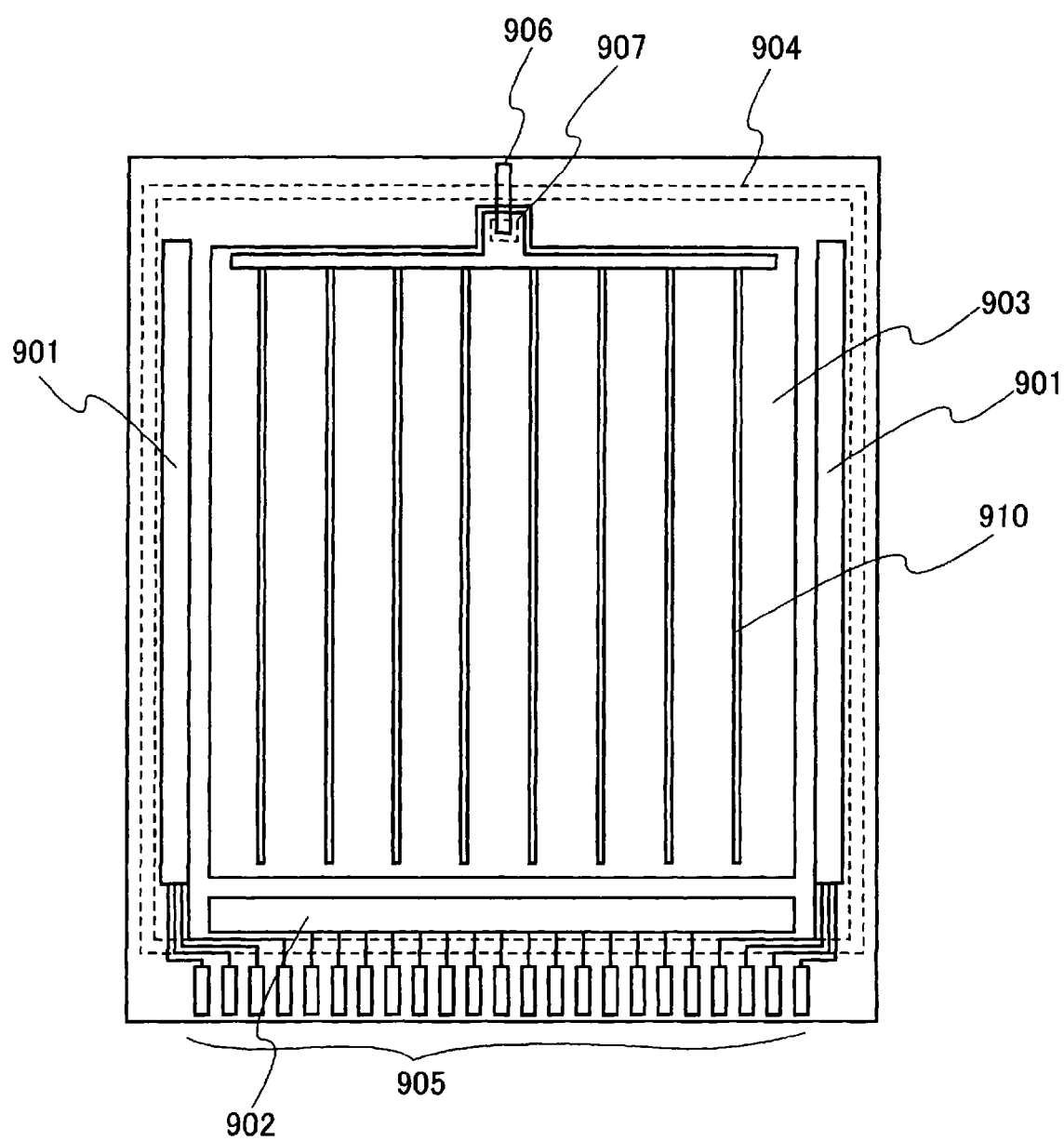
FIG. 16 is a diagram showing a structure of a display region, a driving circuit and a terminal part of a display panel of the invention.

On the other hand, FIG. 16 is a mode which is preferably applied to a display panel of which the screen size is approximately from 10 inches to 40 inches. Compared to the structure of FIG. 11, a gate line driving circuit is provided each side of the display region, and a data line driving circuit and a connecting terminal part 905 are placed on the same side. As auxiliary wirings, a first broad wiring 908, a second broad wiring 909 and a plurality of branch wirings 910 are provided, but the lead wirings are provided on the opposite side of the data line driving circuit, structured separately from the connecting terminal part 905. By such a structure, the distance of the lead wirings to reaching the edge of the substrate 900 can be short, which can reduce the resistance loss.

Figure 13:
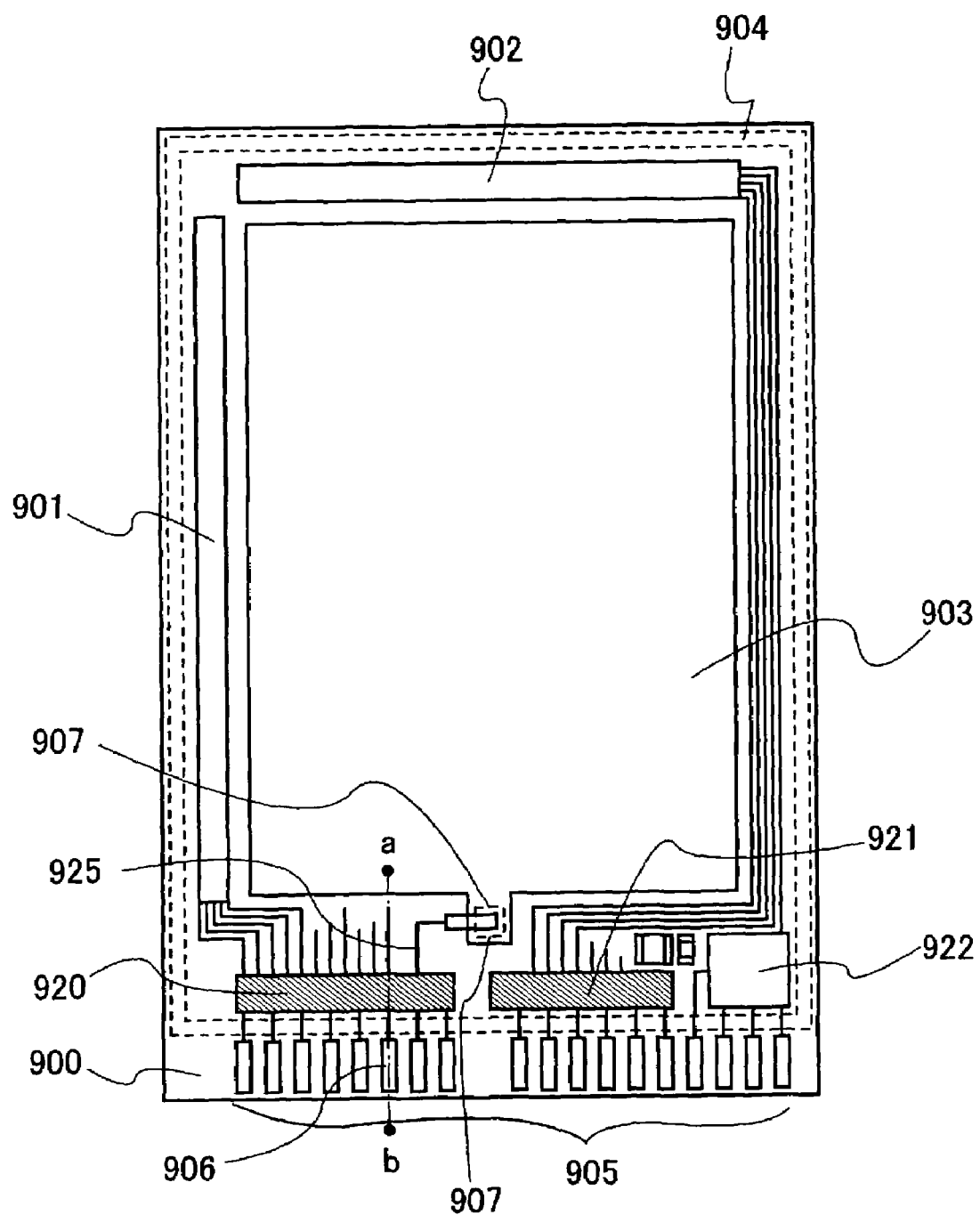
FIG. 13 is a diagram showing a structure of a display region, a driving circuit and a terminal part of a display panel of the invention.

FIG. 13 is a view showing the third structure of the embodiment. In the structure of FIG. 13, substances in common with FIG. 9 are indicated by the same numerals, and the explanation will be omitted. In this structure, on a substrate 900, a gate line driving circuit 901, a data line driving circuit 902, an opposing electrode 903, a connecting terminal part 905, a first IC chip 920, a second IC chip 921 and a light sensor chip 922 are provided. And a sealing region 904 is a region for gluing the substrate 900 and an opposing substrate together. So, when the substrate 900 and the opposing substrate are glued together at the sealing region, the gate line driving circuit 901, the data line driving circuit 902, the opposing electrode 903, the first IC chip 920, the second IC chip 921 and the light sensor chip 922 are encapsulated by the substrate 900, the opposing substrate and a sealing material. The light sensor chip 922 constitutes a part of the function of controlling the grayscale number of display, detecting the external light strength, as described in Embodiment Mode 1. Either one of the first IC chip 920 and the second IC chip 921, or the both may function as controllers.

In this structure, wirings extended from connecting terminals of the connecting terminal part 905 are electrically connected to the IC chips. That is, each connecting terminal is electrically connected to any one of the first IC chip 920, the second IC chip 921 and the light sensor chip 922. In addition, each of the first IC chip 920, the second IC chip 921 and the light sensor chip 922 is connected to the data line driving circuit 902, the gate line driving circuit 901 and the opposing electrode 903, by a plurality of wirings. For example, the first IC chip 920 and the opposing electrode 903 are electrically connected to each other by a wiring 925, through a contact hole 907. The number of IC chips or the arrangement shown in this structure is an example, and not limited to this. For example, a chip capacitor or a laminated ceramic coil may be mounted on the substrate 900, not limited to the IC chips.

Figure 14:
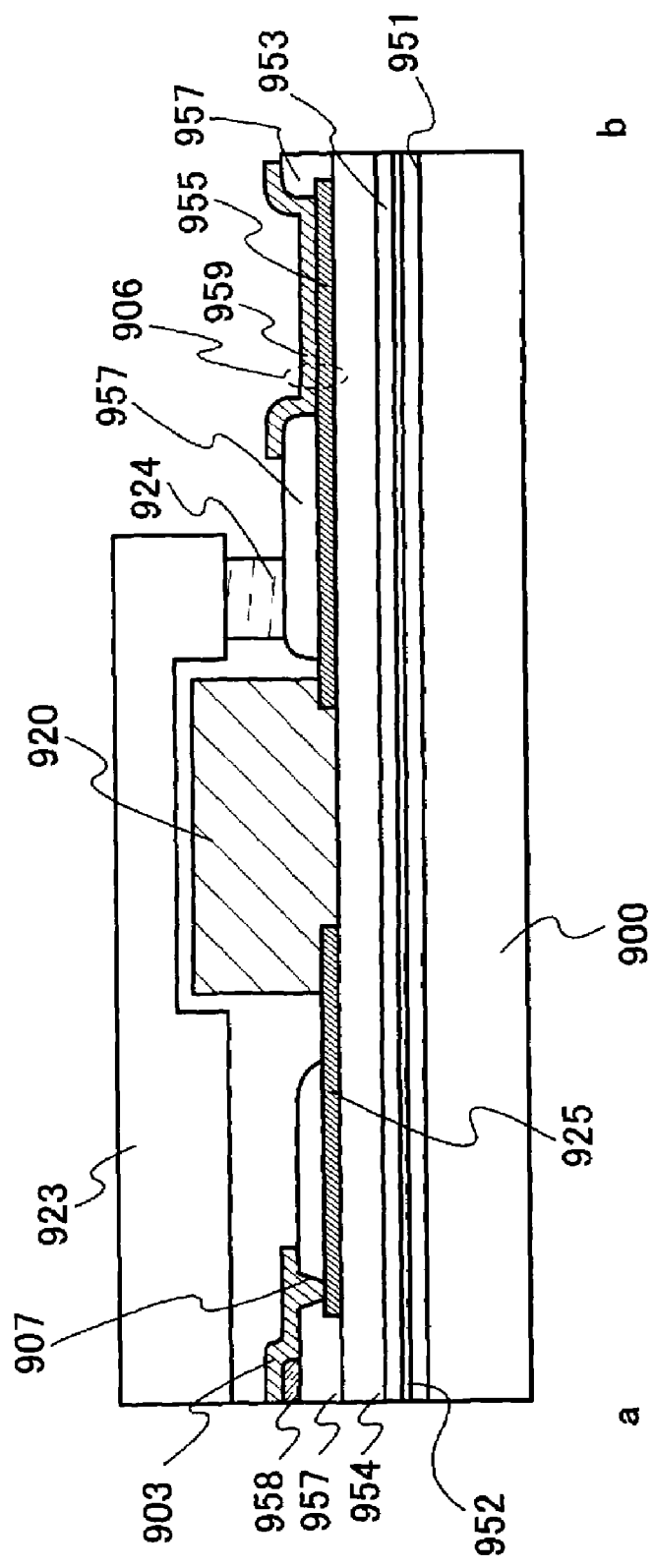
FIG. 14 is a diagram showing a structure of a display region, a driving circuit and a terminal part of a display panel of the invention.

Next, a cross section of the line a-b of FIG. 13 in the case of a display panel of which the substrate 900 and the opposing substrate are glued together at the sealing region 904 with a sealing material is shown in FIG. 14. In the cross-sectional view shown in FIG. 14, substances in common with the structure of FIGS. 10A and 10B are indicated by the same numerals, and the explanation will be omitted.

This structure has a wiring 955 and a wiring 925 on an upper layer insulating film 954. The wiring 955 is formed astride the sealing region 904. And the wiring 925 is formed within the sealing region 904.

An insulting layer 957 is provided on the wiring 955, and the wiring 955 and a connection electrode 959 formed on the insulating layer 957 are electrically connected to each other through a contact hole. In addition, an insulating layer 957 is formed so as to cover the edge of the wiring 925. And on the insulating layer 957 within the sealing region, an EL layer 958 is provided, and an opposing electrode 903 is provided further thereon.

Furthermore, within the sealing region 904, a first IC chip 920 is provided on the upper layer insulating film 954, the wiring 955 and the wiring 925, and the first IC chip 920 is electrically connected to the wiring 955 and the wiring 925.

Furthermore, within the sealing region, a sealing material 924 is provided on the insulating layer 957, and an opposing substrate 923 and the substrate 900 are glued together by the sealing material. The invention is not limited to the structure of the display device described above. In addition, in this embodiment, a display device includes a module to which FPC is connected and a display panel body.

The structure shown in FIG. 13 is preferably applied to a display panel of which the screen size is approximately from 1 to 3 inches.

Embodiment Mode 9

FIG. 17A shows a module made by combining a display panel 1 and a printed-circuit board 2. The display panel 1 is provided with a pixel part 3 where a light-emitting element is placed on each pixel, a first scanning line driving circuit 4, a second scanning line driving circuit 5 and a signal line driving circuit 6 supplying a video signal to the selected pixel. The pixel part 3 is provided with the same structure as Embodiment Mode 6.

On the printed-circuit board 2, a light sensor 29, a controller 7, a CPU 8 (a central processing unit), a memory 9, a power supply circuit 10, a speech processing circuit 11, a transmitting and receiving circuit 12 and the like are provided. The printed-circuit board 2 and the display panel 1 are connected to each other by a flexible substrate 13 (FPC). The flexible substrate 13 may be structured so as to prevent noise on the supply voltage and the signal or poor rise of the signal, by providing a capacitative element, a buffer circuit and the like. In addition, the controller 7, the speech processing circuit 11, the memory 9, the CPU 8 and the like can be mounted on the display panel 1, using a COG (chip on glass) system. By the COG system, scale of the printed-circuit board 2 can be reduced.

Through an interface 14 (I/F part) provided on the printed-circuit board 2, input and output of various control signals are performed. In addition, an antenna port 15 for transmitting and receiving signals with an antenna is provided on the printed-circuit board 2.

FIG. 17B shows a block diagram of the module shown in FIG. 17A. This module includes a VRAM 16 (a video RAM), a DRAM 17 (a dynamic RAM), a flash memory 18 and the like, as the memory 9. The data of image to be displayed on the panel is stored in the VRAM 16, the image data or voice data is stored in the DRAM 17, and various programs are stored in the flash memory.

The CPU 8 has a control signal forming circuit 20, a decoder 21, a register 22, an operational circuit 23, an RAM 24 (a random access memory), an interface 19 for the CPU 8, and the like. Various signals inputted to the CPU 8 via the interface 19 are hold by the register 22 once, and after that, inputted to the operational circuit 23, the decoder 21 and the like. In the operational circuit 23, an operation is carried out based on the signals inputted, and the place to which various commands are sent is specified. On the other hand, signals inputted to the decoder 21 are decoded, and inputted to the control signal forming circuit 20. The control signal forming circuit 20 forms signals including various commands, based on the inputted signals, and sends them to the place specified by the operational circuit 23, such as the memory 9, the transmitting and receiving circuit 12, the speech processing circuit 11, the controller 7 and the like, specifically.

The memory 9, the transmitting and receiving circuit 12, the speech processing circuit 11, the light sensor 29 and the controller 7 operate according to the command received, respectively. The operations will be briefly described hereinafter A signal inputted from an input means 25 is sent to the CPU 8 mounted on the printed-circuit board 2, via the interface 14. The control signal forming circuit 20 converts an image data stored in the VRAM 16 into a predetermined format according to the signal sent from the input means such as a pointing device and a keyboard, and sends it to the controller 7.

The controller 7 receives the signal from the light sensor 29, and changes the grayscale number. In the case where the external light strength is high, it operates so as to decrease the grayscale number, and when low, it operates so as to increase the grayscale number In addition, it performs a data processing to the signal including an image data sent from the CPU, according to the panel specification, and supplies it to the display panel 1. Furthermore, the controller 7 forms a Hsync signal, a Vsync signal, a clock signal CLK, an alternating voltage (AC Cont) and a switching signal L/R, based on a supply voltage inputted from the power supply circuit 10 or various signals inputted from the CPU 8, and supplies them to the display panel 1.

In the transmitting and receiving circuit 12, signals transmitted and received as electric waves at an antenna 28 are processed, and specifically includes high-frequency circuits such as an isolator, a bandpass filter, a VCO (Voltage Controlled Oscillator), an LPF (Low Pass Filter), a coupler, and a balun. Of the signals transmitted and received at the transmitting and receiving circuit 12, signals including speech information are sent to the speech processing circuit 11, according to the command from the CPU 8.

The signal including speech information which is sent according to the command of the CPU 8 is demodulated in the speech processing circuit 11, and sent to the speaker 27. The speech signal sent from the microphone 26 is modulated in the speech processing circuit 11, and sent to the transmitting and receiving circuit 12, according to the command by the CPU 8.

By combining the pixel with the structure shown by FIGS. 17A and 17B and an external light strength detector, light-emitting time of the light-emitting element is changed and the luminance of the display screen can be controlled. Furthermore, by controlling light emission of the light-emitting element by the external light strength detector, the lighting time does not increase uselessly, power consumption of the display panel can be decreased and the lifetime can be extended.

Embodiment Mode 10

The present embodiment mode shows an example of a cell-phone as an electric apparatus of the invention.

Figure 18:
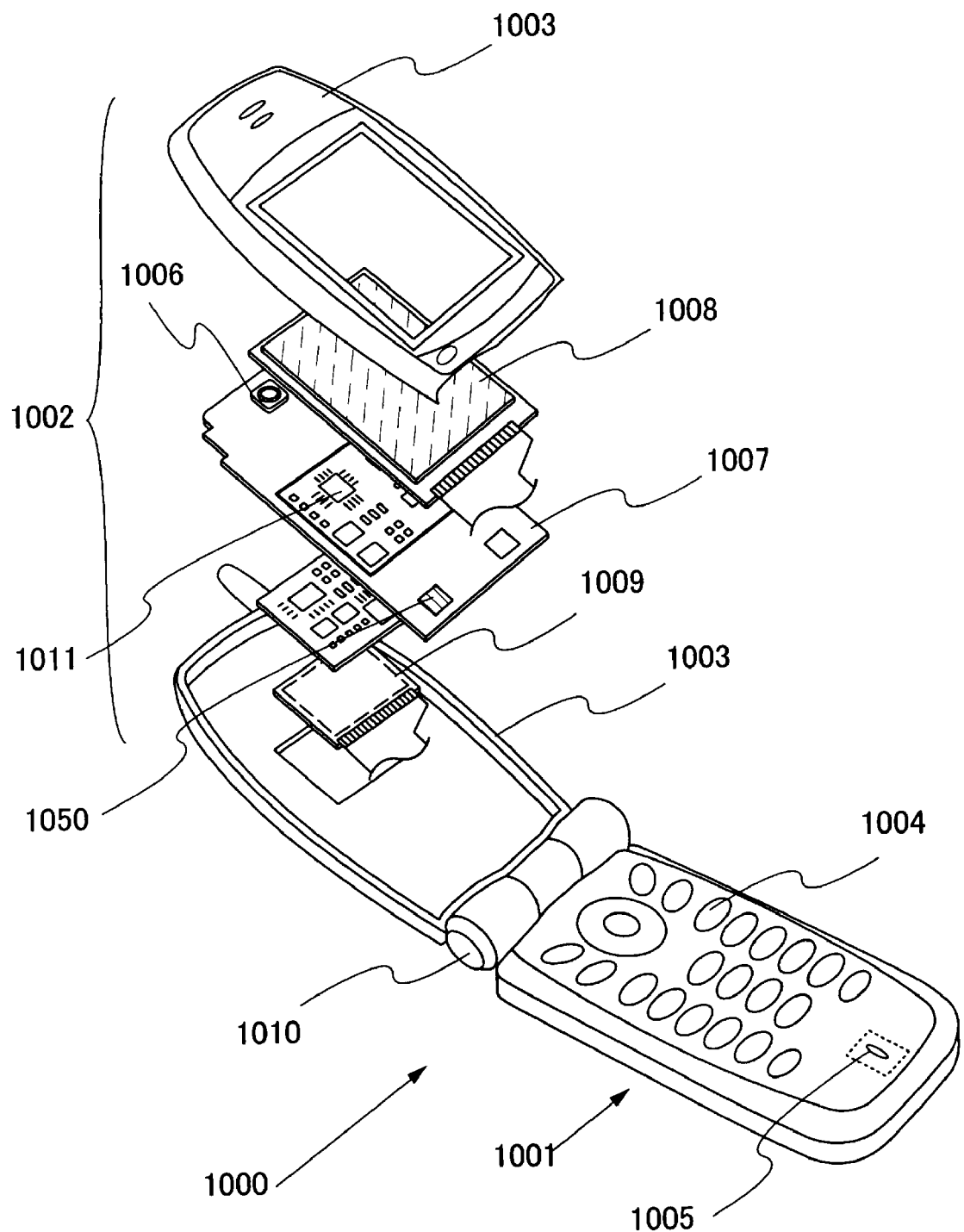
FIG. 18 is a diagram showing an embodiment of a cell-phone which can switch the display modes according to the external light strength.

A cell-phone 1000 shown in FIG. 18 is constituted by a main body A 1001 provided with operating switches 1004, a microphone 1005 and the like, and a main body B 1002 provided with a display panel A 1008, a display panel B 1009, a speaker 1006 and the like, and the main body A and the main body B are joined together by a hinge 1010 so that they are openable and closable. The display panel A 1008 and the display panel B 1009 are put in a chassis 1003 of the main body B 1002, with a circuit board 1007. The display panel A 1008 and the display panel B 1009 are placed so that their pixel parts can be seen from opening windows formed on the chassis 1003. The circuit board 1007 is provided with a signal processing circuit 1011 and a light sensor 1050. The light sensor 1050 is for measuring the external light strength.

As for the display panel A 1008 and the display panel B 1009, the specifications such as the number of pixels can be arbitrarily set according to the function of the cell-phone 1000. For example, they may be combined so that the display panel A 1008 is a main screen, and the display panel B 1009 is a sub-screen.

And, the display panel A 1008 may be a high-definition color display screen displaying characters and an image, and the display panel B 1009 may be a unicolor information display screen displaying character information. Especially, by making the display panel B 1009 an active matrix type, having high-definition, a variety of character information can be displayed and information display density per one screen can be improved. For example, the display panel A 1008 may be set from 2 to 2.5 inches, 64 grayscales, and 260,000 colors QVGA (320 dots×240 dots), and the display panel B 1009 may be set as a high-definition panel with from 180 to 220 ppi, unicolor from 2 to 8 grayscales, so as to display alphabets, hiragana, katakana, Chinese characters, Arabic characters and the like.

Either one of the display panel A 1008 and the display panel B 1009, or both of them have the same structure as Embodiment Modes 1 to 9. That is, by providing the light sensor 1050, the signal processing circuit 1011 and a grayscale number controller which changes the grayscale number according to the external light strength, one of the display panel A 1008 and the display panel B 1009, or both of them can improve visibility of the information displayed on the display screens. In addition, by adding the function of controlling the grayscale number according to the external light strength to a cell-phone, the power consumption can be decreased, which enables long continuous use. Besides, the battery can be miniaturized, and the cell-phone can be lighter.

The cell-phone 1000 like this can perform display with various drive methods. A time grayscale method is one of the examples. The time grayscale displays grayscales by changing the lighting time of a light-emitting element which emits light with a certain luminance. For example, when the light-emitting element emits light for a whole frame period, the lighting rate is 100%. When it emits light for half of one frame period, the lighting rate is 50%. When the frame frequency is high to some extent, generally 60 Hz or more, blinking can not observed by human eyes, and it is recognized as a halftone. In this way, by changing the lighting rate, the grayscale can be expressed.

Figure 19:
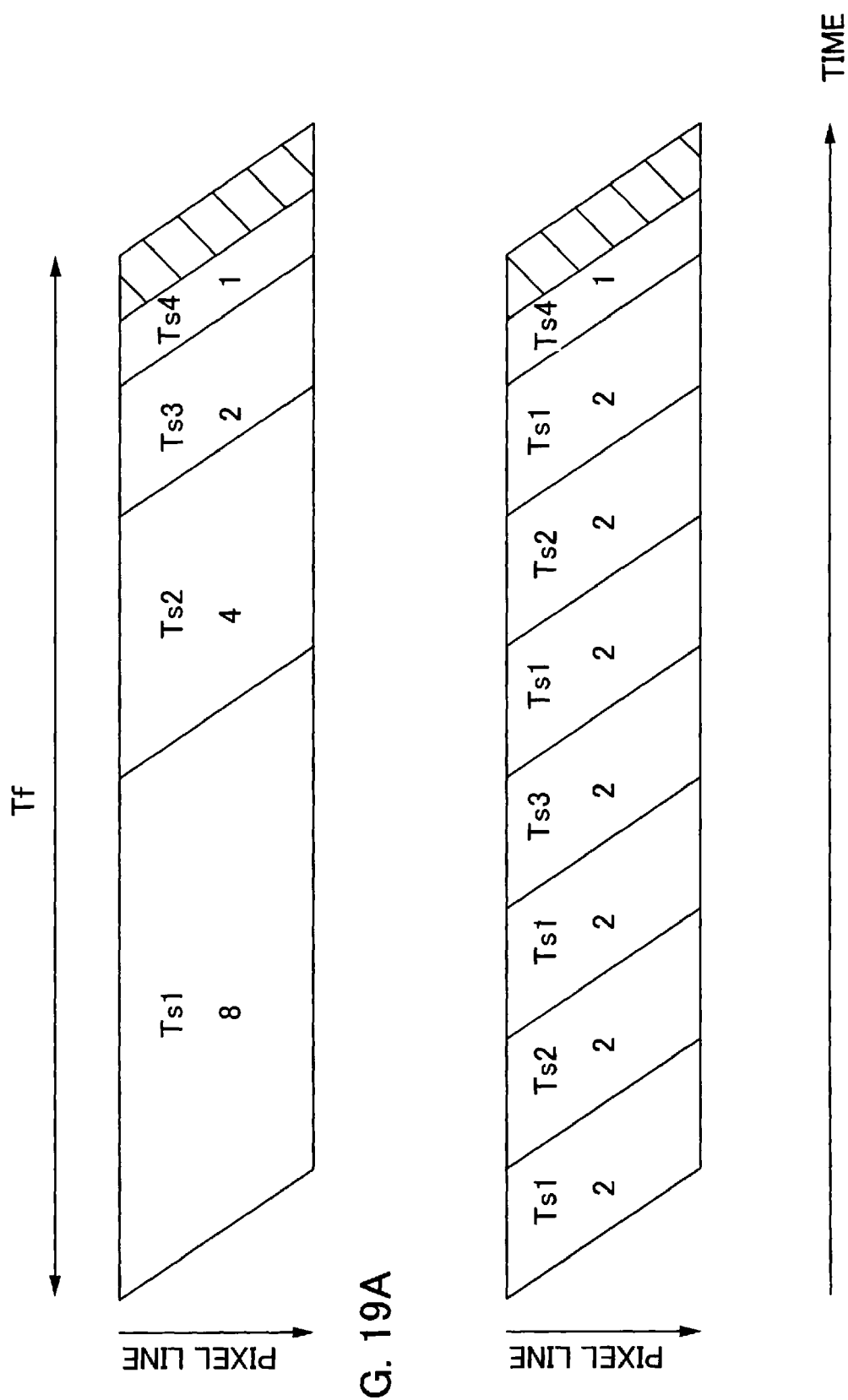
FIGS. 19A and 19B are diagrams explaining a driving method of a cell-phone of Embodiment Mode 10.

In FIG. 19A, the horizontal axis shows time and the vertical axis shows a vertical axis of a pixel of a display screen. In this example, the display screen performs writing from the top in sequence, so the display delays. The writing is performed from the top in sequence in the example of FIG. 19A, but not limited to this. Hereinafter, explanation taking 4 bits as an example will be made.

In FIG. 19A, one frame is divided into 4 sub-frames (Ts1, Ts2, Ts3 and Ts4). The ratio of length of each sub-frame period is as follows: Ts1: Ts2: Ts3: Ts4=8: 4: 2: 1. By combining these sub-frames, the length of lighting period can be set from 0 to 15. In this way, one frame is divided into sub-frames of power of 2, so that the grayscale can be expressed. In addition, since the lighting period of Ts4 is short, it is necessary that the upper half is turned off before the writing of the lower half of the screen is finished, and writing and erasing are performed in parallel.

FIG. 19B shows grayscale display with different time division from FIG. 19A. With the grayscale display method of FIG. 19A, a defect called pseudo contour occurs when the high-order bits are changed. This is caused when human eyes see the seventh grayscale and the eighth grayscale alternately and see an illusion where the video is observed with different grayscale from the actual grayscale. Therefore, in FIG. 19B, the high-order bits are divided and the above-described pseudo contour phenomenon is reduced. Specifically, the highest-order bit (Ts1, here) is divided into 4, and placed within one frame. And the second bit (Ts2, here) is divided into 2, and placed within one frame. In this way, by dividing temporally long bits, pseudo contour is reduced.

Figure 20:
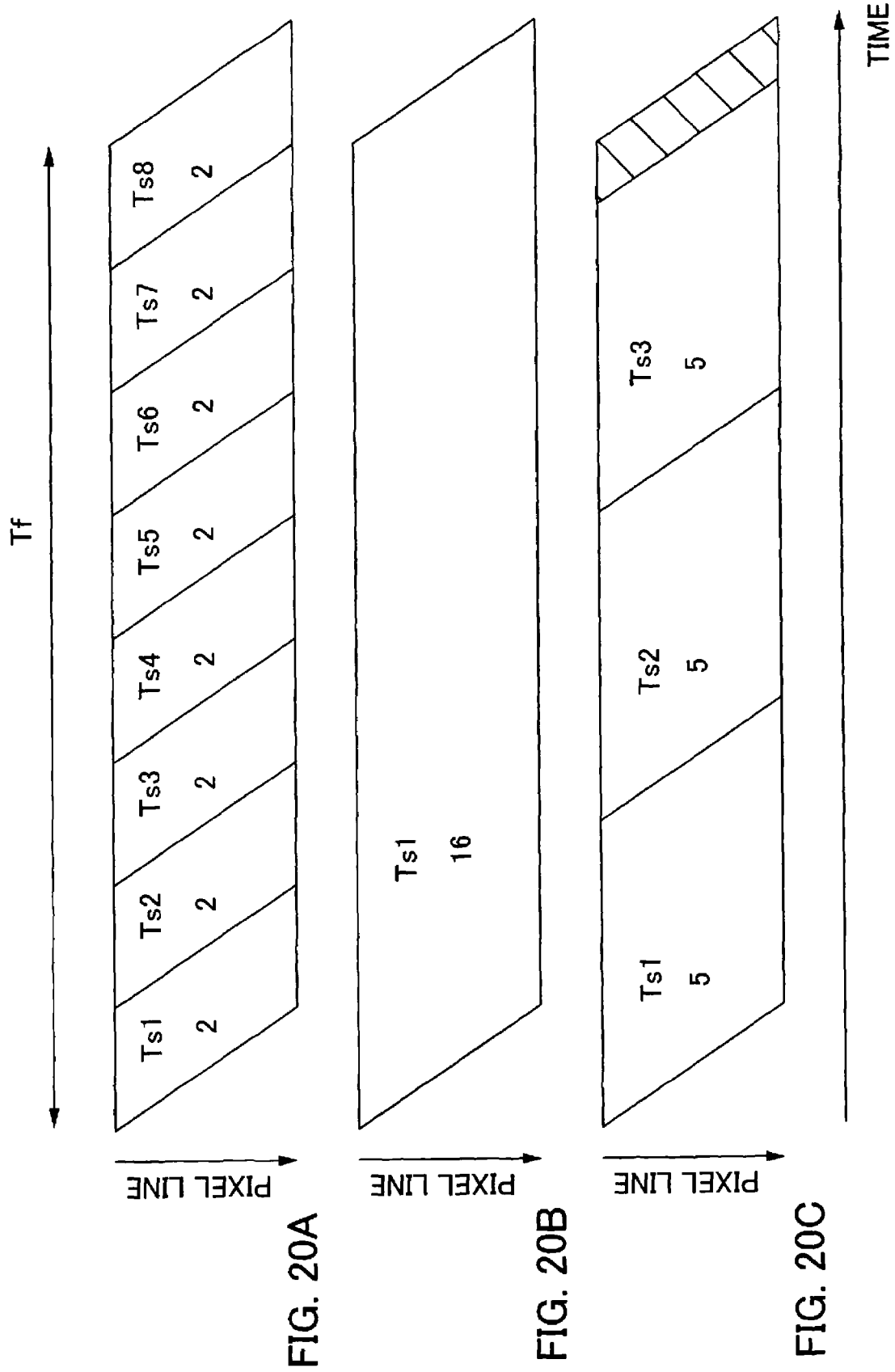
FIGS. 20A, 20B and 20C are diagrams explaining a driving method of a cell-phone of Embodiment Mode 10.

In FIG. 20A, the sub-frames are divided at regular intervals, instead of power of two, so that pseudo contour does not occur. As for this method, there is no big bit division, so pseudo contour does not occur, but the grayscale itself becomes rough. Therefore, grayscale complementation needs to be performed, using FRC (frame rate control), dither, or the like.

FIG. 20B is the case where only binary is performed. In this case, only one sub-frame exists in one frame, so the number of rewriting is once for one frame, and power consumption of the controller and the driver can be reduced. As for a cell-phone, the case where character information such as an e-mail is mainly displayed (a male mode) needs less grayscale number than the case where a moving image or a still image is displayed, so display which prioritizes the power consumption is possible. By combining such display and the above-described FIG. 19A, FIG. 19B, FIG. 20A and the like, the case where a large grayscale number is needed and the case where small grayscale is enough are used separately so that reduction in power consumption becomes possible.

FIG. 20C is the case where 4 grayscales are displayed, and display is performed by writing 3 times in one frame period. This can be applied to the case of displaying a still image such as a comic for which the grayscale number should be larger than the case of displaying character information. The grayscale number may be set in a range of approximately 4 to 16 grayscales.

In this way, as described in Embodiment Modes 1 to 9, a method of changing the grayscale number of display according to the external light strength can be applied to a cell-phone. In this case, for example, by combining driving methods including a natural image or moving image mode of 16 grayscales or more, a still image mode for displaying from 4 to 16 grayscales and a mail mode for displaying from 2 to 8 grayscales, the power consumption of the cell phone can be decreased.

A cell-phone of the embodiment can be transformed into various modes according to the function and use. For example, by mounting an image pickup device on the hinge 1010 site, it may be a camera-equipped cell-phone. In addition, even when the cell-phone is made to have a structure in which the operating switches 1004, the display panel A 1008 and the display panel B 1009 are put in one chassis, the above-described function effects can be achieved. Furthermore, even when the structure of the embodiment is applied to an information display terminal provided with a plurality of display parts, the same effects can be obtained. Furthermore, the structure of the embodiment mode is not limited to a cell-phone, and can be applied widely to information terminals typified by a computer provided with a display panel and input means such as operating switches, and a PDA (Personal Digital Assistant).

Figure 21:
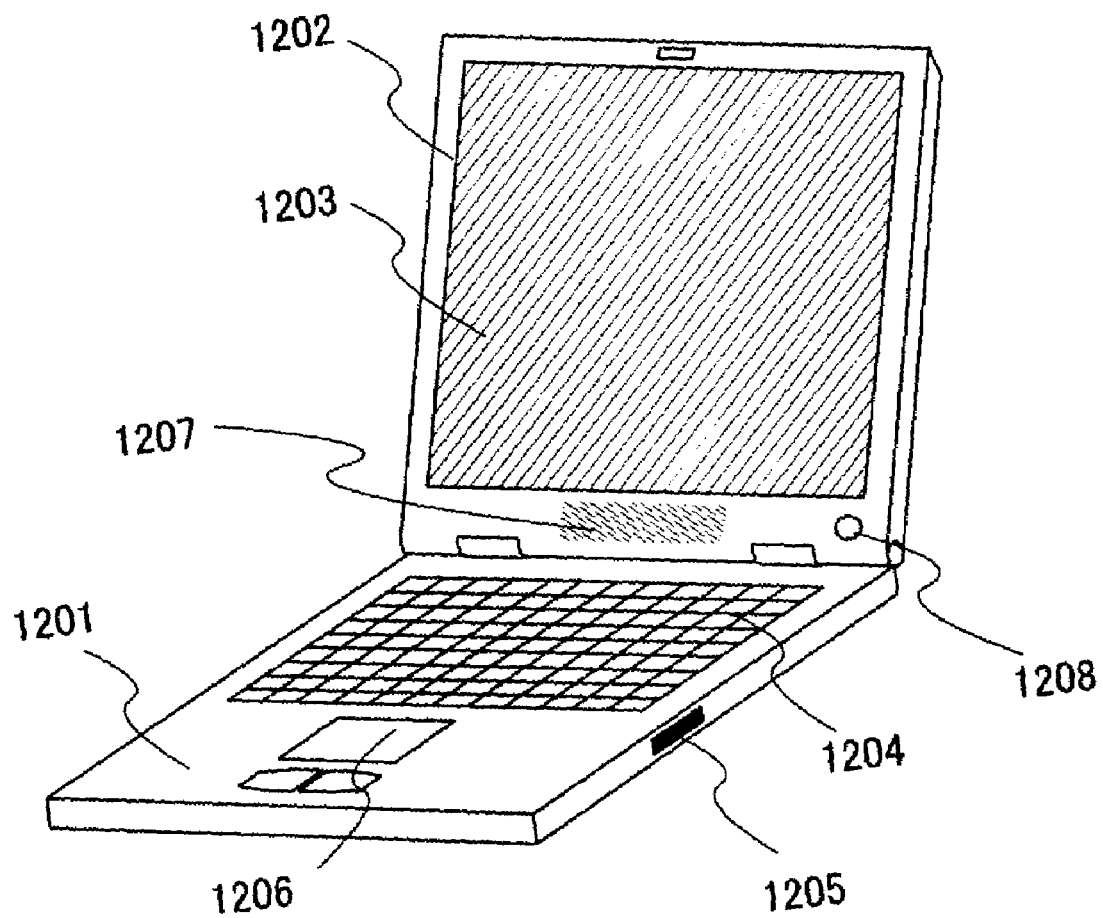
FIG. 21 is a diagram showing an embodiment of a computer which can switch the display modes according to the external light strength.

FIG. 21 is a computer, and includes a main body 1201, a chassis 1202, a display part 1203, a keyboard 1204, an external connection port 1205, a pointing mouse 1206 and a light sensor 1208. By the invention, a computer having high visibility even under strong external light can be structured. The computer is easily used by a user, and can decrease eyestrain.

Embodiment Mode 11

Figure 22A:
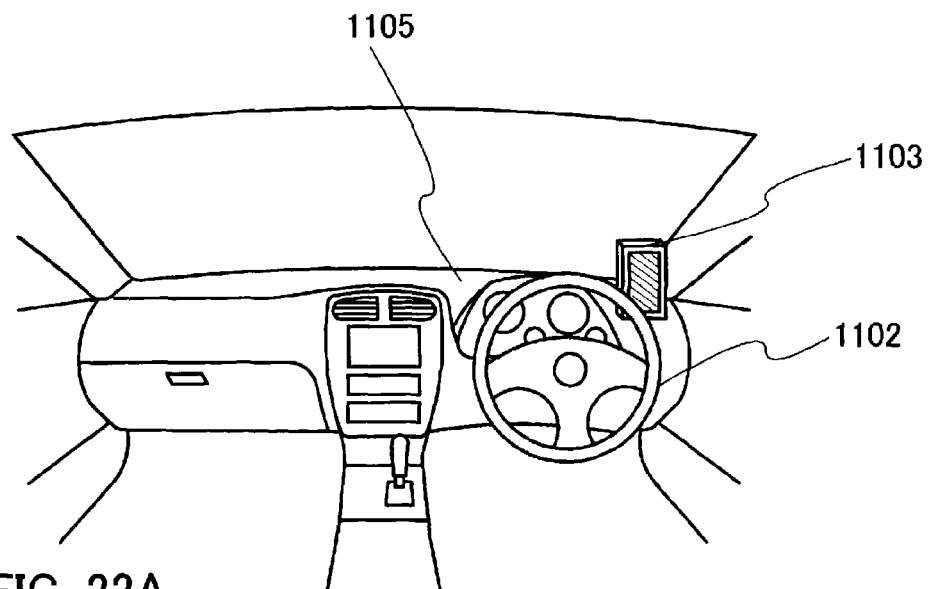
FIGS. 22A and 22B are diagrams showing an embodiment of a car including a display panel which can switch the display modes according to the external light strength.
Figure 22B:
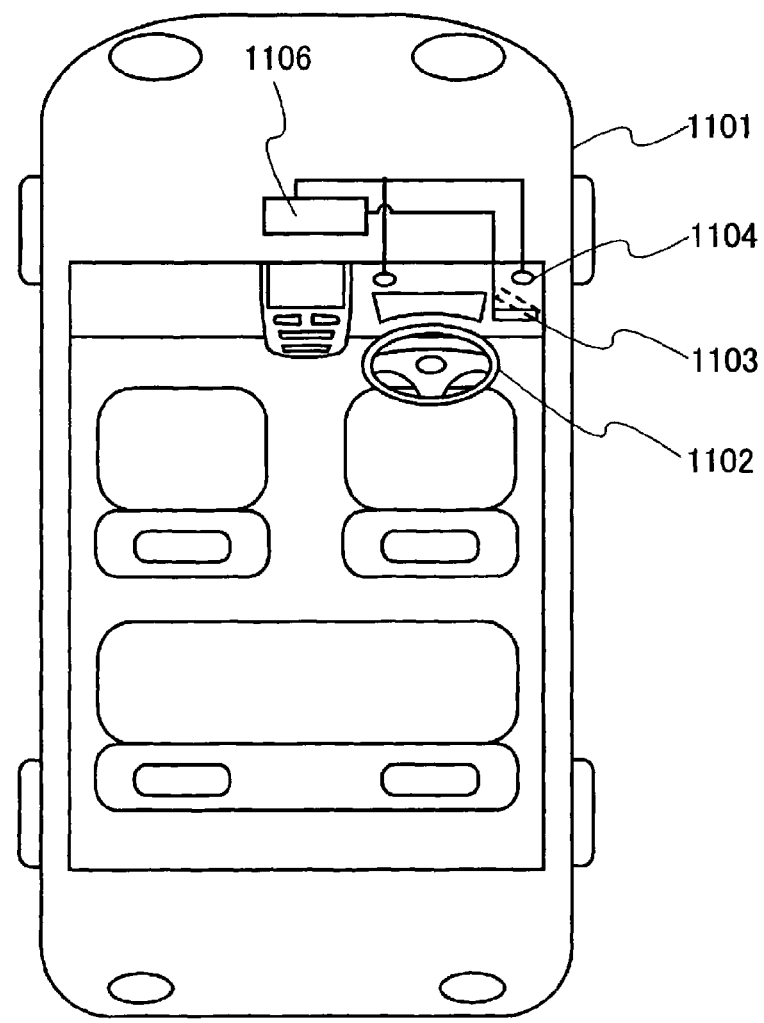

FIGS. 22A and 22B shows an embodiment of a car of the invention. This car includes a sensor detecting the external light strength and a display device which performs display of a low grayscale when the external light strength is high, performs display of a high grayscale when the external light strength is low, and performs display of the middle grayscale when the external light strength is between the two.

FIG. 22A shows a driver's seat of the car, and FIG. 22B shows a condition seen from the top face. A display panel 1103 is provided on the right side of a steering wheel 1102 (on the left side in the case of a left-hand drive car) on a console panel 1105. The size of the display panel 1103 is not limited especially, but an oblong 3.5-inch panel or the like is a preferred mode as a size which does not disturb the driver's view and displays information effectively. The display panel 1103 can be placed obliquely making an angle of from 5 to 30 degrees to the driver. The display panel 1103 as this is preferably structured as FIG. 9 shown in Embodiment Mode 8.

The display panel 1103 detects the external light strength by a light sensor 1004 provided on a part or a plurality of parts of the console panel 1105. A control unit 1106 controls the display grayscale number of the display panel 1103, according to the external light strength. On the display panel 1103, information useful for the driver, such as a map, traffic jam information and a weather forecast can be displayed. That is, by combining it and a GPS system, a navigation system can be structured. In this case, even when direct sunlight comes inside of the car 1101 and especially the display panel 1103 is receiving the sunlight, the information displayed on the display panel 1103 is visible, as described in Embodiment Mode 1.

Additional Statement

As described above, according to the invention, the following modes can be led.

A display device having a display part, a controller supplying a video signal to the display part and a light sensor receiving external light and outputting a signal according to the external light strength, wherein the controller includes a grayscale converting part changing grayscale number of a video signal and a grayscale output selecting part selecting the grayscale number which is outputted to a display panel, according to an output of the light sensor.

A display device having a display part, a controller supplying a video signal to the display part and a light sensor receiving external light and outputting a signal according to the external light strength, wherein the controller includes a grayscale converting part changing grayscale number of a video signal and a grayscale output selecting part selecting the grayscale number which is outputted to a display panel, according to an output of the light sensor, and the display device performs display of low grayscale when the external light strength is high, performs display of high grayscale when the external light strength is low, and performs display of middle grayscale when the external light strength is between the two.

A display device having a display part, a controller supplying a video signal to the display panel, a memory part storing the video signal and a light sensor receiving external light and outputting a signal according to the external light strength, wherein the controller includes a grayscale converting part changing grayscale number of a video signal and storing it in the memory part, and a grayscale output selecting part retrieving a video signal to be outputted to a display panel according to an output of the light sensor and transmitting it to the display part.

A display device having a display part, a controller supplying a video signal to the display panel, a memory part storing the video signal and a light sensor receiving external light and outputting a signal according to the external light strength, wherein the controller includes a grayscale converting part changing grayscale number of a video signal and storing it in the memory part, and a grayscale output selecting part retrieving a video signal to be outputted to a display panel according to an output of the light sensor and transmitting it to the display part, and the display device performs display of low grayscale when the external light strength is high, performs display of high grayscale when the external light strength is low, and performs display of middle grayscale when the external light strength is between the two.

A driving method of a display device having a display part, a controller supplying a video signal to the display part and a light sensor receiving external light and outputting a signal according to the external light strength, wherein the display device performs display of low grayscale when the external light strength is high, performs display of high grayscale when the external light strength is low, and performs display of middle grayscale when the external light strength is between the two, according to an output of the light sensor.

A driving method of a display device having a display part, a controller supplying a video signal to the display part and a light sensor receiving external light and outputting a signal according to the external light strength, wherein display modes for text display, still image display and moving image display are switched over according to a video signal, and the display device performs display of low grayscale when the external light strength is high, performs display of high grayscale when the external light strength is low, and performs display of middle grayscale when the external light strength is between the two, according to an output of the light sensor.

A driving method of a display device having a display part, a controller supplying a video signal to the display part and a light sensor receiving external light and outputting a signal according to the external light strength, wherein display modes for text display, still image display and moving image display are switched over according to a video signal, and the display device performs display of from 2 to 8 grayscales in a text display mode, performs display of from 4 to 16 grayscales in a picture display mode performing display of an image with a small number of colors, performs display of from 64 to 1024 grayscales in a video mode performing display of a natural image with a large number of colors including a moving image, switching the display modes according to an output of the light sensor.

A driving method of a display device having a display part, a controller supplying a video signal to the display part and a light sensor receiving external light and outputting a signal according to the external light strength, wherein display modes for text display, still image display and moving image display are switched over according to a video signal, and the display device performs display of 2 grayscales when the external light strength is 100,000 lux, performs display of from 2 to 8 grayscales when the external light strength is from 10,000 to 100,000 lux, performs display of from 4 to 16 grayscales when the external light strength is from 1,000 to 10,000 lux, performs display of from 16 to 64 grayscales when the external light strength is from 100 to 1,000 lux, and performs display of from 64 to 1024 grayscales when the external light strength is less than 100 lux, according to an output of the light sensor.

In the driving method of the display device, a display device of which the light sensor receives external light, and displays character information and a still image with lower grayscale when the external light strength is high under sunlight of sunny daytime, than that of when the external light strength is low in a room with a fluorescent light, is included.

In the driving method of the display device, a display device which performs display of from 2 to 8 grayscales in an environment under sunlight of sunny daytime or sunlight of cloudy daytime, and from 4 to 16 grayscales in an environment under sunlight an hour before sunset of a sunny day or under sunlight an hour after sunrise of a cloudy day, or in an environment under an indoor fluorescent light, is included.

This application is based on Japanese Patent Application serial no. 2005-133803 filed in Japan Patent Office on May 2, 2005, the entire contents of which are hereby incorporated by reference.

What is claimed is:

1. A display device comprising:
a display part;
a controller for receiving an original video signal; and
a light sensor for receiving external light,
wherein the controller includes:
a grayscale converting part for changing a grayscale number of the original video signal, and for outputting a changed digital video signal; and
a grayscale output selecting part for selectively supplying the changed digital video signal to the display part, according to a strength of the external light, and
wherein the display device is configured to perform a display of from 2 to 8 grayscales in a text display mode, a display of from 4 to 16 grayscales in a still image display mode, and a display of from 64 to 1024 grayscales in a moving image mode.

2. A display device comprising:
a display part;
a controller for receiving an original video signal; and
a light sensor for receiving external light,
wherein the controller includes:
a grayscale converting part for changing a grayscale number of the original video signal, and for outputting a changed digital video signal; and
a grayscale output selecting part for selectively supplying the changed digital video signal to the display part, according to a strength of the external light,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

3. A display device comprising:
a display part;
a controller for receiving an original video signal; and
a light sensor for receiving external light,
wherein the controller includes:
a grayscale converting part for changing a grayscale number of the original video signal, and for outputting a changed video signal; and
a grayscale output selecting part for selectively supplying the changed video signal to the display part, according to a strength of the external light,
wherein a grayscale number of the changed video signal is i when the strength of the external light is x lux,
wherein the grayscale number of the changed video signal is j when the strength of the external light is y lux,
wherein the grayscale number of the changed video signal is k when the strength of the external light is z lux,
wherein i, j and k are natural numbers which fulfill a formula $i>j>k$, and
wherein x, y, and z are positive real numbers which fulfill a formula $x<y<z$.

4. The display device, according to claim 3, wherein the display device is configured to perform a display of from 2 to 8 grayscales in a text display mode, a display of from 4 to 16 grayscales in a still image display mode, and a display of from 64 to 1024 grayscales in a moving image mode.

5. The display device, according to claim 3,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

6. A display device comprising:
a display part;
a controller for receiving an original video signal;
a memory part; and
a light sensor for receiving external light,
wherein the controller includes:
a grayscale converting part for changing a grayscale number of the original video signal, and for outputting a changed digital video signal to the memory part; and
a grayscale output selecting part for selectively supplying the changed digital video signal stored in the memory part to the display part, according to a strength of the external light, and
wherein the display device is configured to perform a display of from 2 to 8 grayscales in a text display mode, a display of from 4 to 16 grayscales in a still image display mode, and a display of from 64 to 1024 grayscales in a moving image mode.

7. A display device comprising:
a display part;
a controller for receiving an original video signal;
a memory part; and
a light sensor for receiving external light,
wherein the controller includes:
   a grayscale converting part for changing a grayscale number of the original video signal, and for outputting a changed digital video signal to the memory part; and
   a grayscale output selecting part for selectively supplying the changed digital video signal stored in the memory part to the display part, according to a strength of the external light,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

8. A display device comprising:
a display part;
a controller for receiving an original video signal;
a memory part; and
a light sensor for receiving external light,
wherein the controller includes:
   a grayscale converting part for changing a grayscale number of the original video signal, and for outputting a changed video signal to the memory part; and
   a grayscale output selecting part for selectively supplying the changed video signal stored in the memory part to the display part, according to a strength of the external light,
wherein a grayscale number of the changed video signal is i when the strength of the external light is x lux,
wherein the grayscale number of the changed video signal is j when the strength of the external light is y lux,
wherein the grayscale number of the changed video signal is k when the strength of the external light is z lux,
wherein i, j and k are natural numbers which fulfill a formula i>j>k, and
wherein x, y, and z are positive real numbers which fulfill a formula x<y<z.

9. The display device, according to claim 8, wherein the display device is configured to perform a display of from 2 to 8 grayscales in a text display mode, a display of from 4 to 16 grayscales in a still image display mode, and a display of from 64 to 1024 grayscales in a moving image mode.

10. The display device, according to claim 8,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

11. A driving method of a display device comprising the steps of:
receiving external light in a light sensor;
supplying an original video signal to a controller;
changing a grayscale number of the original video signal and outputting a changed video signal in a grayscale converting part of the controller; and
supplying the changed video signal selectively from the controller to a display part, according to a strength of the external light,
wherein a grayscale number of the changed video signal is i when the strength of the external light is x lux,
wherein the grayscale number of the changed video signal is j when the strength of the external light is y lux,
wherein the grayscale number of the changed video signal is k when the strength of the external light is z lux,
wherein i, j and k are natural numbers which fulfill a formula i>j>k, and
wherein x, y, and z are positive real numbers which fulfill a formula x<y<z.

12. The driving method of the display device, according to claim 11,
wherein the display device is configured to perform a display of from 2 to 8 grayscales in a text display mode, a display of from 4 to 16 grayscales in a still image display mode, and a display of from 64 to 1024 grayscales in a moving image mode.

13. The driving method of the display device, according to claim 11,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

14. A driving method of a display device comprising the steps of:
receiving external light in a light sensor;
supplying an original video signal to a controller;
changing a grayscale number of the original video signal and outputting a changed video signal in a grayscale converting part of the controller; and
supplying the changed video signal selectively from the controller to a display part, according to a strength of the external light,
wherein a grayscale number of the changed video signal is i when the strength of the external light is x lux,
wherein the grayscale number of the changed video signal is j when the strength of the external light is y lux,
wherein the grayscale number of the changed video signal is k when the strength of the external light is z lux,
wherein i, j and k are natural numbers which fulfill a formula i>j>k,
wherein x, y, and z are positive real numbers which fulfill a formula x<y<z, and
wherein display modes for text display, still image display and moving image display are switched over according to the strength of the external light.

15. The driving method of the display device, according to claim 14,
wherein the display device is configured to perform a display of from 2 to 8 grayscales in a text display mode, a display of from 4 to 16 grayscales in a still image display mode, and a display of from 64 to 1024 grayscales in a moving image mode.

16. The driving method of the display device, according to claim 14,
wherein a grayscale number of the changed video signal is any one of 2 to 8 when the external light strength is from 10,000 to 100,000 lux, and
wherein the grayscale number of the changed video signal is any one of 4 to 16 when the external light strength is from 1,000 to 10,000 lux.

17. A driving method of a display device comprising the steps of:
receiving external light in a light sensor;
supplying an original video signal to a controller;

changing a grayscale number of the original video signal and outputting a changed video signal in a grayscale converting part bf the controller; and supplying the changed video signal selectively from the controller to a display part, according to a strength of the external light, wherein display modes for text display, still image display and moving image display are switched over according to the strength of the external light, wherein a grayscale number of the changed video signal is any one of 2 to 8, in the text display mode, wherein the grayscale number of the changed video signal is any one of 4 to 16, in the still image display mode, and wherein the grayscale number of the changed video signal is any one of 64 to 1024, in the moving image display mode.

18. The driving method of the display device, according to claim 17, wherein a grayscale number of the changed video signal is any one of 2 to 8 when the external light strength is from 10,000 to 100,000 lux, and wherein the grayscale number of the changed video signal is any one of 4 to 16 when the external light strength is from 1,000 to 10,000 lux.

19. A driving method of a display device comprising the steps of:

receiving external light in a light sensor;

supplying an original video signal to a controller;

changing a grayscale number of the original video signal and outputting a changed video signal in a grayscale converting part of the controller; and supplying the changed video signal selectively from the controller to a display part, according to a strength of the external light, wherein a grayscale number of the changed video signal is 2, when the external light strength is no less than 100,000 lux, wherein the grayscale number of the changed video signal is any one of 2 to 8, when the external light strength is fewer than 100,000 lux and no less than 10,000 lux, wherein the grayscale number of the changed video signal is any one of 4 to 16, when the external light strength is fewer than 10,000 lux and no less than 1,000 lux, wherein the grayscale number of the changed video signal is any one of 16 to 64, when the external light strength is fewer than 1,000 lux and no less than 100 lux, and wherein the grayscale number of the changed video signal is any one of 64 to 1024, when the external light strength is fewer than 100 lux.

20. The driving method of the display device, according to claim 19, wherein the display device is configured to perform a display of from 2 to 8 grayscales in a text display mode, a display of from 4 to 16 grayscales in a still image display mode, and a display of from 64 to 1024 grayscales in a moving image mode.

21. A display device comprising:

a display part;

a controller for receiving an original video signal; and a light sensor for receiving external light, wherein the controller includes:

a grayscale converting part for changing a grayscale number of the original video signal, and for outputting a changed digital video signal; and a grayscale output selecting part for selectively supplying the changed digital video signal to the display part, according to a strength of the external light, wherein the grayscale converting part outputs a plurality of changed digital video signals including the changed digital video signal, and a total grayscale number of each of the plurality of changed digital video signals is 32 grayscales, 16 grayscales, 8 grayscales, and 4 grayscales respectively.

22. The display device, according to claim 3, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

23. A display device comprising:

a display part;

a controller for receiving an original video signal;

a memory part; and a light sensor for receiving external light, wherein the controller includes:

a grayscale converting part for changing a grayscale number of the original video signal, and for outputting a changed digital video signal to the memory part; and a grayscale output selecting part for selectively supplying the changed digital video signal stored in the memory part to the display part, according to a strength of the external light, wherein the grayscale converting part outputs a plurality of changed digital video signals including the changed digital video signal, and a total grayscale number of each of the plurality of changed digital video signals is 32 grayscales, 16 grayscales, 8 grayscales, and 4 grayscales respectively.

24. The display device, according to claim 8, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

25. The driving method of the display device, according to claim 11, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

26. The driving method of the display device, according to claim 14, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

27. The driving method of the display device, according to claim 17, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

28. The driving method of the display device, according to claim 19, wherein the grayscale converting part outputs a plurality of changed video signals including the changed video signal, and a total grayscale number of each of the plurality of changed video signals is 32 grayscales, 16 grayscales, 8 grayscales, and 4 grayscales respectively.

* * * * *

UNITED STATES PATENT AND TRADEMARK OFFICE
CERTIFICATE OF CORRECTION

PATENT NO. : 7,724,247 B2 Page 1 of 1
APPLICATION NO. : 11/381062
DATED : May 25, 2010
INVENTOR(S) : Shunpei Yamazaki et al.

It is certified that error appears in the above-identified patent and that said Letters Patent is hereby corrected as shown below:

In the Claims:
Column 31, line 3, in claim 17 replace "bf" with --of--.

Signed and Sealed this

Fourteenth Day of September, 2010

David J. Kappos
*Director of the United States Patent and Trademark Office*